(12) United States Patent
Kim et al.

(10) Patent No.: US 10,748,855 B2
(45) Date of Patent: Aug. 18, 2020

(54) LAMINATING DEVICE AND METHOD FOR FABRICATING SEMICONDUCTOR PACKAGE USING THE SAME

(71) Applicant: Samsung Electronics Co., Ltd., Suwon-si (KR)

(72) Inventors: Tea-Geon Kim, Asan-si (KR); Jung Lae Jung, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 188 days.

(21) Appl. No.: 15/900,284

(22) Filed: Feb. 20, 2018

(65) Prior Publication Data

US 2019/0051618 A1     Feb. 14, 2019

(30) Foreign Application Priority Data

Aug. 14, 2017     (KR) .......................... 10-2017-0103083

(51) Int. Cl.
*H01L 23/00* (2006.01)
*B32B 37/22* (2006.01)
(Continued)

(52) U.S. Cl.
CPC ............ *H01L 23/562* (2013.01); *B32B 37/10* (2013.01); *B32B 37/223* (2013.01); *H01L 21/4864* (2013.01); *H01L 21/67092* (2013.01); *H01L 21/67121* (2013.01); *H01L 24/81* (2013.01); *B32B 2457/08* (2013.01); *H01L 21/67132* (2013.01); *H01L 22/12* (2013.01); *H01L 23/49822* (2013.01); *H01L 24/16* (2013.01); *H01L 2224/16225* (2013.01); *H01L 2224/16227* (2013.01); *H01L 2224/81007* (2013.01); *H01L 2924/3511* (2013.01); *H01L 2924/37001* (2013.01)

(58) Field of Classification Search
CPC ................ B32B 37/10; B32B 37/1027; H01L 21/67132; H01L 23/562
USPC ......... 156/285, 382, 244.14, 244.21, 244.27, 156/580, 581, 583.1, 583.3
See application file for complete search history.

(56) References Cited

U.S. PATENT DOCUMENTS

| 5,930,654 A | 7/1999 | Tohyama et al. |
| 7,811,899 B2 | 10/2010 | Yamamoto |
| (Continued) | | |

FOREIGN PATENT DOCUMENTS

| JP | 09-219383 | 8/1997 |
| KR | 10-2004-0080960 A | 9/2004 |
| (Continued) | | |

*Primary Examiner* — Philip C Tucker
*Assistant Examiner* — Jimmy R Smith, Jr.
(74) *Attorney, Agent, or Firm* — Muir Patent Law, PLLC

(57) ABSTRACT

A method of fabricating a semiconductor package using a laminating device is provided. The method includes placing a substrate on a substrate stand; providing a pressurizing unit which is expandable and includes a convex surface facing an upper surface of the substrate stand, on the substrate stand; injecting air into the pressurizing unit using a plate which is connected to the pressurizing unit; and supplying a film by a film supply unit which supplies the film between the substrate stand and the pressurizing unit, wherein the pressurizing unit attaches the film onto the substrate, while expanding.

14 Claims, 24 Drawing Sheets

(51) Int. Cl.
*H01L 21/67* (2006.01)
*H01L 21/48* (2006.01)
*B32B 37/10* (2006.01)
*H01L 21/66* (2006.01)
*H01L 23/498* (2006.01)

(56) References Cited

U.S. PATENT DOCUMENTS

| | | |
|---|---|---|
| 2004/0177811 A1 | 9/2004 | Kobayashi |
| 2008/0011412 A1 | 1/2008 | Tsujimoto et al. |
| 2008/0138936 A1* | 6/2008 | Yamamoto ............. B32B 37/10 438/118 |
| 2009/0095426 A1 | 4/2009 | Yoshioka |
| 2009/0107633 A1 | 4/2009 | Yamaguchi et al. |
| 2010/0276074 A1 | 11/2010 | Nakayama |
| 2011/0100530 A1* | 5/2011 | Ujiie ................. B32B 17/10036 156/106 |
| 2012/0013979 A1* | 1/2012 | Biteau .............. B29D 11/00644 359/465 |
| 2016/0009025 A1* | 1/2016 | Lee .................... B32B 37/0053 156/324 |
| 2017/0133249 A1 | 5/2017 | Kim et al. |

FOREIGN PATENT DOCUMENTS

| | | |
|---|---|---|
| KR | 10-0574982 | 5/2006 |
| KR | 10-1517697 | 5/2015 |
| KR | 10-1681842 B1 | 12/2016 |

\* cited by examiner

LAMINATING DEVICE AND METHOD FOR FABRICATING SEMICONDUCTOR PACKAGE USING THE SAME

This application claims the benefit of priority under 35 U.S.C § 119 to Korean Patent Application No. 10-2017-0103083 filed on Aug. 14, 2017 in the Korean Intellectual Property Office, the disclosure of which is incorporated herein by reference in its entirety.

BACKGROUND OF THE INVENTION

1. Field of the Invention

The present disclosure relates to a laminating device and a method for fabricating a semiconductor package using the same. More specifically, the present disclosure relates to a laminating device for a printed circuit board (PCB) and a method for fabricating a semiconductor package using the same.

2. Description of the Related Art

As semiconductor devices are highly integrated and electronic devices become smaller and multifunctional, various packaging techniques of semiconductor devices are desired. In particular, for semiconductor packages requiring high performance, techniques for mounting a semiconductor chip on a thin printed circuit board (PCB) are being performed.

The thin printed circuit boards are typically vulnerable to external forces, and in many cases, failures occur during the fabricating process of the semiconductor packages. Thus, a protective film may be attached onto a thin printed circuit board to enhance the stiffness of the printed circuit board. However, a bubble and a warpage generated on the film during the laminating process of the protective film cause defects of the semiconductor package.

SUMMARY OF THE INVENTION

An aspect of the present inventive concept provides a laminating device capable of improving yield of a semiconductor package.

Another aspect of the present inventive concept provides a method for fabricating a semiconductor package with improved yield.

The aspects of the present inventive concept are not limited to those mentioned above and another aspect which has not been mentioned can be clearly understood by those skilled in the art from the description below.

According to aspects of the present inventive concept, there is provided a method of fabricating a semiconductor package using a laminating device, the method comprising: placing a substrate on a substrate stand; providing a pressurizing unit which is expandable and includes a convex surface facing an upper surface of the substrate stand, on the substrate stand; injecting air into the pressurizing unit using a plate which is connected to the pressurizing unit; and supplying a film by a film supply unit which supplies the film between the substrate stand and the pressurizing unit, wherein the pressurizing unit attaches the film onto the substrate, while expanding.

According to aspects of the present inventive concept, there is provided a method of fabricating a semiconductor package using a laminating device comprising: placing a substrate stand a substrate; providing a pressurizing unit which is expandable and includes a convex surface facing an upper surface of the substrate stand; and supplying a film by a film supply unit which provides the film between the substrate stand and the pressurizing unit, wherein the pressurizing unit attaches the film onto the substrate, while expanding, and the film supply unit increases the length of the film to be supplied with expansion of the pressurizing unit.

According to aspects of the present inventive concept, there is provided a method for fabricating a semiconductor package, the method comprising: disposing a substrate including a first surface and a second surface opposite each other on a substrate stand; providing a pressurizing unit on the substrate stand, the pressurizing unit including a convex surface facing the first surface of the substrate stand; providing a film between the substrate and the pressurizing unit; and applying the film onto the first surface of the substrate by expanding the pressurizing unit to attach the film onto the first surface of the substrate.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 2 is an exploded perspective view for explaining the laminating device of FIG. 1a.

DETAILED DESCRIPTION OF THE INVENTION

Hereinafter, a laminating device according to some embodiments of the present inventive concept will be described with reference to FIGS. 1a, 1b, and 2.

Figure 1A:
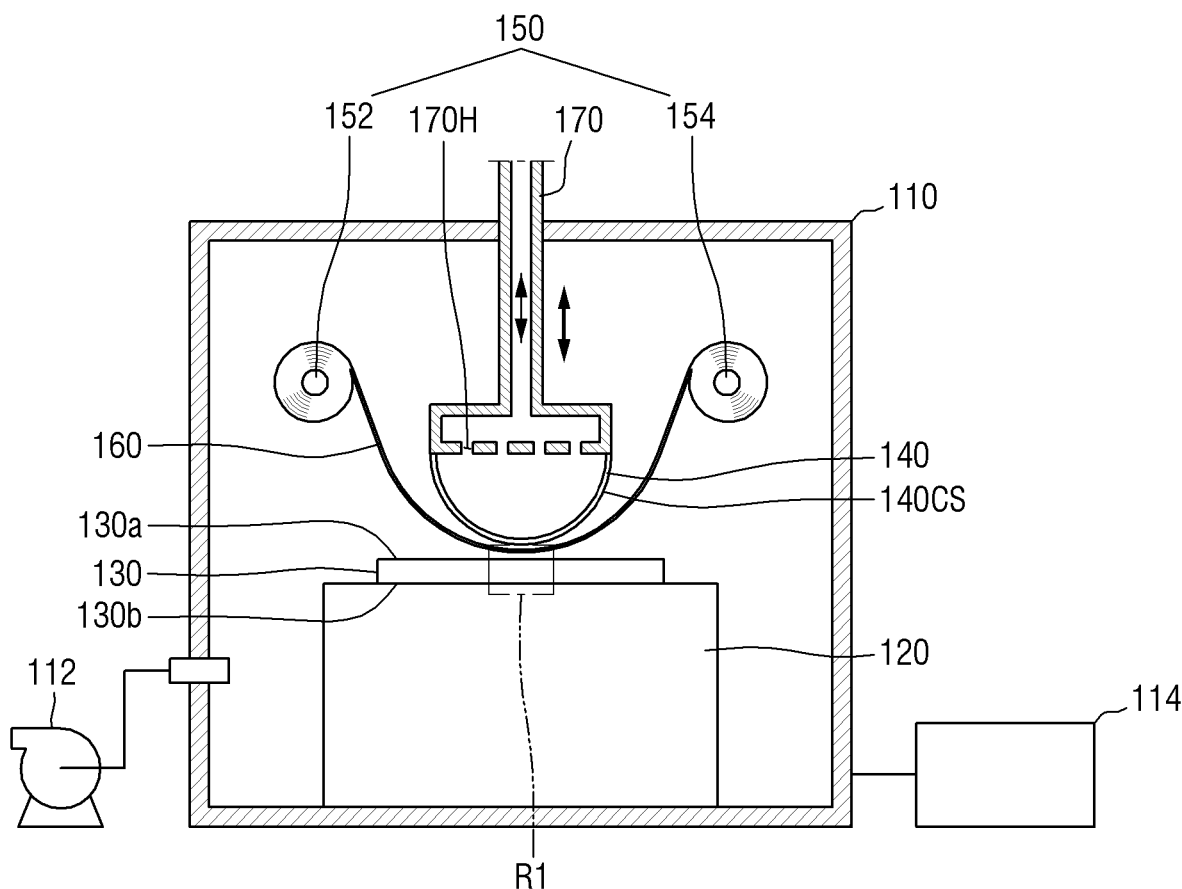
FIG. 1a is a schematic view for explaining a laminating device according to some embodiments of the present inventive concept.

FIG. 1a is a schematic view for explaining a laminating device according to some embodiments of the present inventive concept. FIG. 1b is an enlarged view of a first region R1 of FIG. 1. FIG. 2 is an exploded perspective view for explaining the laminating device of FIG. 1a.

Figure 1B:
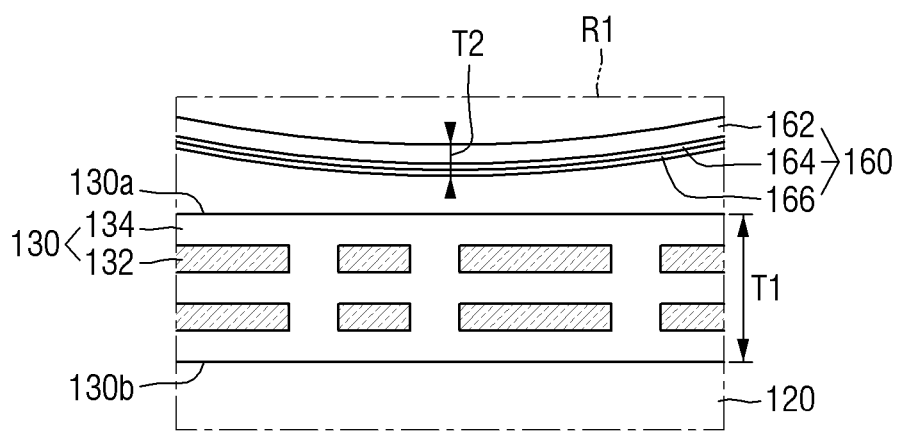
FIG. 1b is an enlarged view of a first region R1 of FIG. 1.
Figure 2:
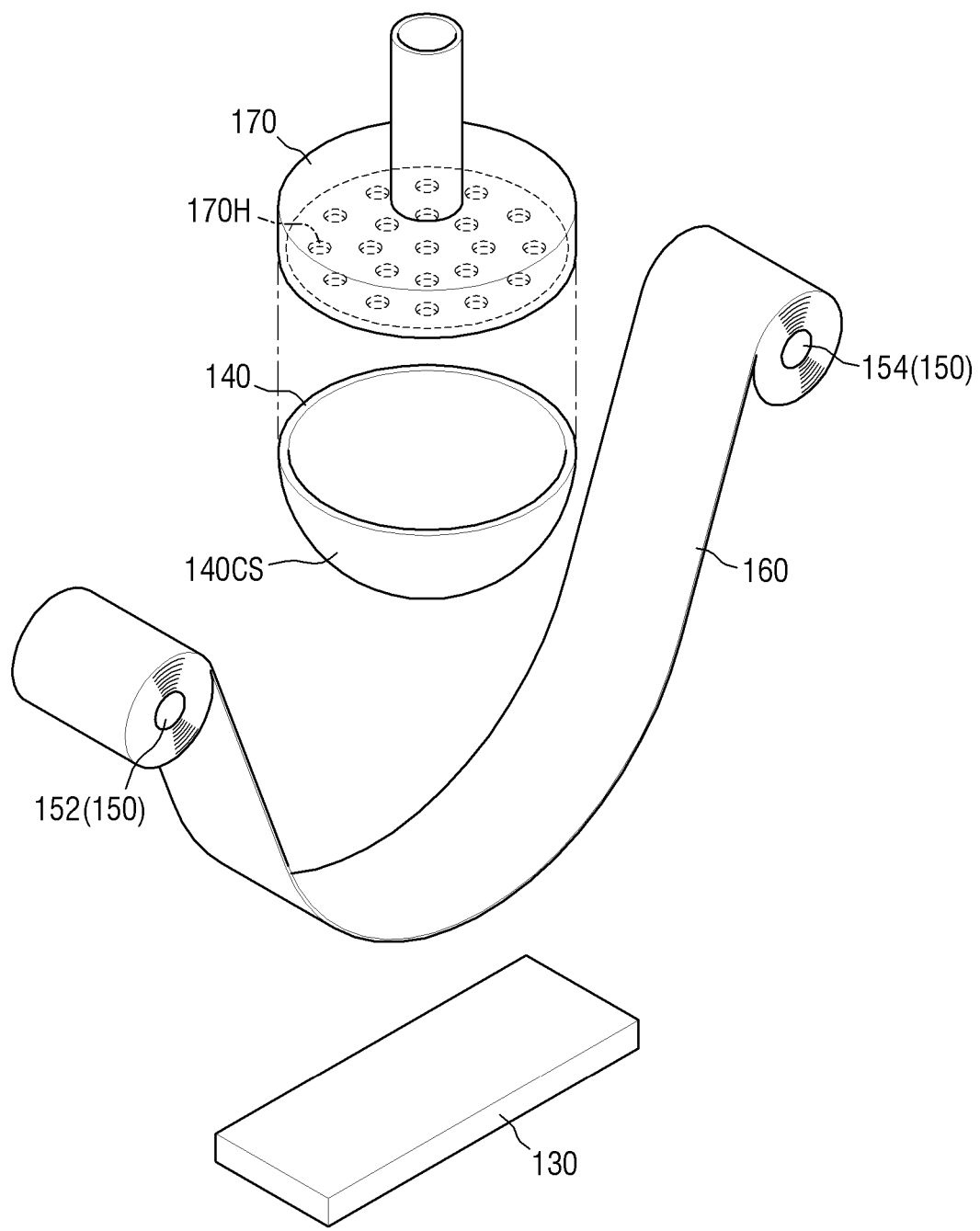

Referring to FIGS. 1a, 1b and 2, the laminating device according to some embodiments includes a chamber 110, a substrate stand 120 (which may also be referred to as a substrate holder), a pressurizing unit 140, a plate 170, and a film supply unit 150.

The chamber 110 may have a cylindrical shape with an internal space, but the disclosure is not limited thereto. For example, the chamber 110 may have a cylindrical shape or a square container shape.

The chamber 110 may provide a space in which the laminating process is performed. For example, the substrate stand 120, the pressurizing unit 140, the plate 170, and the film supply unit 150 may be placed inside the chamber 110. However, the present disclosure is not limited thereto, and some of the substrate stand 120, the pressurizing unit 140, the plate 170, and the film supply unit 150 may also be placed outside the chamber 110.

The chamber 110 may include, for example, a metal material, but the present disclosure is not limited thereto.

In some embodiments, the chamber 110 may be a vacuum chamber. For example, the chamber 110 may be connected to a vacuum pump 112. The vacuum pump 112 may form and maintain a vacuum state inside the chamber 110. Further, the vacuum pump 112 may evacuate impurities inside the chamber 110.

In some embodiments, the chamber 110 may include a temperature controller 114. The temperature controller 114 may control the temperature inside the chamber 110. For example, the temperature controller 114 may heat or cool the interior of the chamber 110 in which the vacuum state is formed. This allows the temperature controller 114 to form and maintain a temperature optimized for the laminating process.

The substrate stand 120 may be disposed in the chamber to support the substrate 130. For example, the substrate 130 may be disposed on a top surface of the substrate stand 120 facing a bottom portion of the pressurizing unit 140. The substrate stand 120 may be fixed to a lower part of the chamber 110, but the substrate stand 120 may also be raised from the lower part of the chamber 110 and lowered and/or rotated inside the chamber 110 as needed.

The substrate 130 may be a packaging substrate. For example, the substrate 130 may be a printed circuit board (PCB). For example, as illustrated in FIG. 1b, the substrate 130 may include a plurality of wiring patterns 132 and an insulating layer 134.

The plurality of wiring patterns 132 may include a conductor. Thus, the plurality of wiring patterns 132 may be electrically connected to a semiconductor chip (e.g., 190 of FIG. 9) disposed on the substrate 130. Although it is not illustrated, the substrate 130 may include a plurality of bonding pads which connects the plurality of wiring patterns 132 to the outside (e.g., outside of the semiconductor package).

The substrate 130 may include a first surface 130a and a second surface 130b opposite each other. The first surface 130a of the substrate 130 may be a surface that faces the bottom portion of the pressurizing unit 140 and to which a film 160 (e.g., a tape film) is attached. For example, the film 160 may be attached onto the first surface 130a of the substrate 130, using the laminating device according to some exemplary embodiments. The second surface 130b of the substrate 130 may be a surface that faces the top surface of the substrate stand 120. The second surface 130b of the substrate 130 may come into contact with the substrate stand 120. Therefore, the substrate 130 may be disposed on the substrate stand 120.

In some exemplary embodiments, the substrate 130 may be a thin printed circuit board (PCB). For example, a thickness T1 of the substrate 130 in a direction perpendicular to an upper surface of the substrate stand 120 may be 0.2 mm or less. The pressurizing unit 140 may be disposed on the substrate stand 120. Further, the pressurizing unit 140 may include a convex surface 140CS facing the upper surface of the substrate stand 120 or a meniscus shape bent toward the upper surface of the substrate stand 120. For example, as illustrated in FIG. 2, the pressurizing unit 140 may be in the shape of a hemisphere with an empty interior. In this exemplary embodiment, the convex surface 140CS may be an outer surface of the hemisphere facing the upper surface of the substrate stand 120. The substrate 130 and the film 160 may be disposed in the chamber 110, when the lamination process is performed. The film 160 may contact the first surface 130a of the substrate 130, in response to a pressure exerted from the pressurizing unit 140. The chamber 110 may be configured to isolate the substrate 130 and the film 160 from the outside environment. The film 160 may be disposed near a center region of the chamber 110. The substrate 130 may be disposed below the film 160. In some embodiments, in a stage of the lamination process, the film 160 may be bent toward the substrate 130. During the lamination process, the film 160 may form a convex downward shape.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The pressurizing unit 140 may attach the film 160 to the substrate 130, using the convex surface 140CS. This will be described later in detail with reference to FIGS. 4 to 7.

In some exemplary embodiments, the pressurizing unit 140 may be expandable. For example, the pressurizing unit 140 may expand by air injected into the interior thereof. However, when air is not injected into the interior, the pressurizing unit 140 may maintain its shape. For example, when air is not injected into the pressurizing unit 140, the pressurizing unit 140 may maintain a hemispherical shape with an empty interior. The term "air" as discussed herein, may refer to atmospheric air, or other gases that may be present during the manufacturing process.

The pressurizing unit 140 may include, for example, at least one of natural rubber, neoprene, nitrile rubber (nitrile-butadiene rubber: NBR), butyl rubber (isobutylene isoprene rubber: IIR or polyisobutylene: PIB), EPDM rubber (ethylene propylene diene monomer rubber), FKM (fluoro elastomer), polyurethane, polyvinyl chloride (PVC), or a combination thereof. However, the present disclosure is not limited thereto, and the pressurizing unit 140 may include a substance capable of maintaining its shape and being expandable.

The plate 170 may be connected to the pressurizing unit 140. For example, as illustrated in FIGS. 1a and 2, the lower surface of the plate 170 may be connected to the upper surface of the pressurizing unit 140. Therefore, the pressurizing unit 140 may be disposed between the plate 170 and the substrate stand 120.

When the pressurizing unit 140 has a hemispherical shape, e.g., when air is not injected into the pressurizing unit 140, the upper surface of the pressurizing unit 140 may have a circular shape. As a result, the bottom surface of the plate 170 may also have a circular shape.

The plate 170 may adjust the internal pressure of the pressurizing unit 140. For example, the plate 170 may include a plurality of plate holes 170H on the lower surface connected to the pressurizing unit 140. The plate 170 may inject air into the pressurizing unit 140 through the plate holes 170H or may discharge air from the interior of the pressurizing unit 140. When the plate 170 injects air into the inside of the pressurizing unit 140, the pressurizing unit 140 may expand. When the plate 170 discharges air from the interior of the pressurizing unit 140, the pressurizing unit 140 may contract.

In some embodiments, the plate 170 may be operated in a desired manner. For example, the plate 170 may be operated in a direction coming closer to or away from the substrate stand 120. For example, the plate 170 on the substrate stand 120 may be operated in the vertical direction and may move closer to or away from the substrate stand 120. Since the pressurizing unit 140 is connected to the plate 170, the pressurizing unit 140 may also be operated in the direction coming closer to or away from the substrate stand 120.

The plate 170 may include, for example, a metal material, but the present disclosure is not limited thereto.

The film supply unit 150 may supply the film 160 between the substrate 130 and the pressurizing unit 140. Specifically, the film supply unit 150 may supply the film 160 so that the film 160 may be attached onto the first surface 130a of substrate 130.

In some exemplary embodiments, the film supply unit 150 may supply the film 160 such that the film 160 extends along the convex surface 140CS of the pressurizing unit 140. For example, the film supply unit 150 may include a first roller 152 and a second roller 154 disposed on opposite sides of the pressurizing unit 140, respectively.

The film 160 may extend between the first roller 152 and the second roller 154. In some embodiments, the first roller 152 and the second roller 154 may be disposed to be higher than the lowermost portion of the pressurizing unit 140. Therefore, the film 160 may extend in a sagging shape below the pressurizing unit 140 due to its own load. For example, the film 160 may extend along the convex surface 140CS of the pressurizing unit 140. The film 160 extending between the first roller 152 and the second roller 154 may have a convex shape in the same direction as the convex surface 140CS of the pressurizing unit 140. The first roller 152 and the second roller 154 may be disposed to be at the same level in a vertical direction.

In some embodiments, the film supply unit 150 may adjust the length of the film 160 to be supplied. For example, the first roller 152 and the second roller 154 may rotate to adjust the length of the film 160 extending between the first roller 152 and the second roller 154. For example, in FIG. 1a, the first roller 152 may rotate in a clockwise direction and the second roller 154 may rotate in a counter-clockwise direction, thereby increasing the length of the film 160 extending between the first roller 152 and the second roller 154. In contrast, the first roller 152 may rotate in the counter-clockwise direction and the second roller 154 may rotate in the clockwise direction, thereby decreasing the length of the film 160 extending between the first roller 152 and the second roller 154.

Also, the film supply unit 150 may increase the length of the film 160 to be supplied with expansion of the pressurizing unit 140. This will be described later in detail with reference to FIG. 5a.

The film 160 may be a film attached to the packaging substrate. In some embodiments, the film 160 may be a protective film that is attached to the packaging substrate to protect the packaging substrate. For example, when the substrate 130 is a thin printed circuit board, the film 160 may be a PCB protective film. The thickness T2 of the film 160 in a direction perpendicular to an upper surface of the substrate stand 120 may be, for example, 50 μm or less. In some embodiments, the thickness T2 of the film 160 is less than the thickness T1 of the substrate 130 in a direction perpendicular to the upper surface of the substrate stand 120.

In some embodiments, the film 160 may be formed by a plurality of films. For example, as illustrated in FIG. 1b, the film 160 may include a first protective film 162, a second protective film 164, and an adhesive film 166. However, the present disclosure is not limited thereto, and the film 160 may be a single film.

The first protective film 162 and the second protective film 164 may be attached to the substrate 130 to protect the substrate 130 and enhance the strength of the substrate 130. The adhesive film 166 may contain an adhesive substance to enhance adhesion between the substrate 130 and the film 160.

In some embodiments, the strength of the first protective film 162 may be stronger than the strength of the second protective film 164. For example, the film 160 may include protective films of various strengths as necessary. The term strength as used herein refers to relative physical characteristics of a film to withstand the pressure exerted by the pressurizing unit 140 without being damaged.

Figure 3:
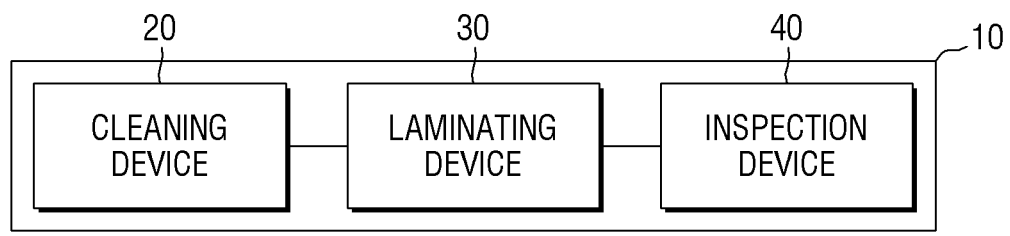
FIG. 3 is a block diagram for explaining a semiconductor package fabricating facility according to some embodiments of the present inventive concept.

FIG. 3 is a block diagram for explaining a semiconductor package fabricating facility according to some exemplary embodiments of the present inventive concept. For the sake of convenience of explanation, the repeated parts of those described in FIGS. 1a, 1b and 2 will be briefly described or omitted.

Semiconductor package fabricating facility 10 of according to some embodiments includes a cleaning device 20, a laminating device 30, and an inspection device 40.

The cleaning device 20 may clean the surface of the substrate 130 and supply the substrate 130 to the laminating device 30. For example, the cleaning device 20 may clean the surface of the substrate 130, before the film 160 is attached onto the substrate 130 by the laminating device 30.

The cleaning device 20 may clean the surface of the substrate 130 by a non-contact type cleaning method, for example such as cyclone dust collection cleaning, ultrasonic cleaning, and ionizer air knife cleaning. Alternatively, the cleaning device 20 may clean the surface of the substrate 130 by a contact type cleaning method using, for example, a cleaning brush or a cleaning tape.

The laminating device 30 may attach the film 160 onto the substrate 130 and supply the film 160 to the inspection device 40. The laminating device 30 may be, for example, the laminating device described in FIGS. 1a, 1b and 2.

The inspection device 40 may inspect whether or not the film 160 attached onto the substrate 130 is defective. For example, the inspection device 40 may perform bubble inspecting which inspects whether there is a bubble such as an air trap or a void in the attached film 160.

For example, the inspection device 40 may include a camera that images the surface of the substrate 130 onto which the film 160 is attached. The camera captures the substrate 130 supplied from the laminating device 30 as a still image to process the image and may inspect whether the film 160 has a bubble.

In some embodiments, the cleaning device 20, the laminating device 30 and the inspection device 40 may be configured in-line. For example, the semiconductor package fabricating facility 10 according to some implementations may be an in-line semiconductor package fabricating facility that includes the cleaning device 20, the laminating device 30, and the inspection device 40.

Hereinafter, a method for fabricating a semiconductor package using a laminating device according to some embodiments of the present inventive concept will be described with reference to FIGS. 4 to 9.

Figure 4:
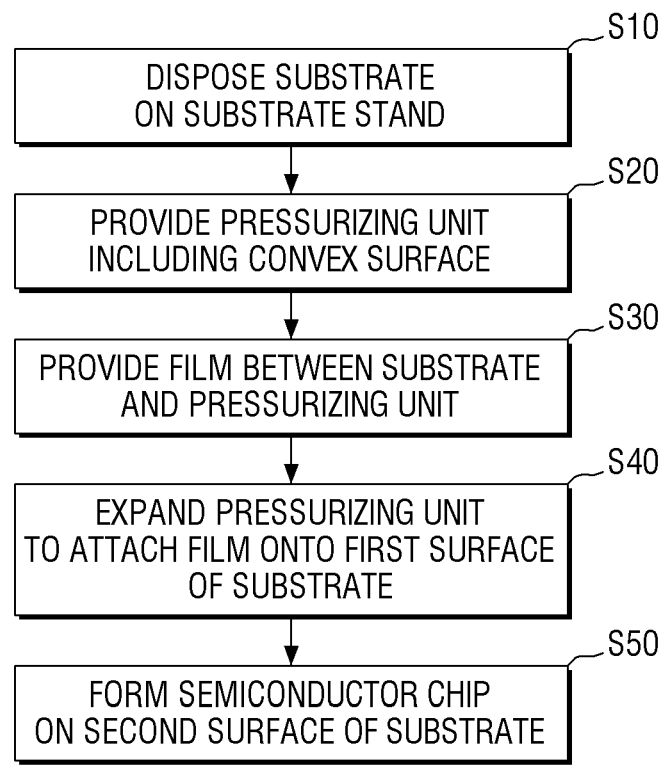
FIG. 4 is a flowchart illustrating a method for fabricating a semiconductor package using a laminating device according to some embodiments of the present inventive concept.

FIG. 4 is a flowchart illustrating a method for fabricating a semiconductor package using a laminating device according to some embodiments of the present inventive concept. FIGS. 5a to 9 are schematic diagrams for explaining a method for fabricating a semiconductor package using the laminating device of FIG. 1a. For the sake of convenience of explanation, repeated parts of those described with reference to FIGS. 1a to 3 will be briefly described or omitted.

Referring to FIGS. 1a and 4, the substrate 130 (e.g., a package substrate) is placed on the substrate stand 120 (S10). Further, the pressurizing unit 140 including the convex surface 140CS is provided on the substrate stand 120 (S20). Further, the film 160 is provided between the substrate 130 and the pressurizing unit 140 (S30).

In some embodiments, the film 160 may be provided to extend along the convex surface 140CS of the pressurizing unit 140, as illustrated in FIG. 1a. For example, the film 160 may be provided to have a convex shape in the same direction as the convex surface 140CS of the pressurizing unit 140.

In some embodiments, the substrate 130 may be cleaned before placing the substrate 130 on the substrate stand 120. The substrate 130 may be cleaned, for example, using the cleaning device 20 of FIG. 3.

Referring to FIGS. 4 to 7, the pressurizing unit 140 is expanded to attach the film 160 to the first surface 130a of the substrate 130 (S40).

Figure 5A:
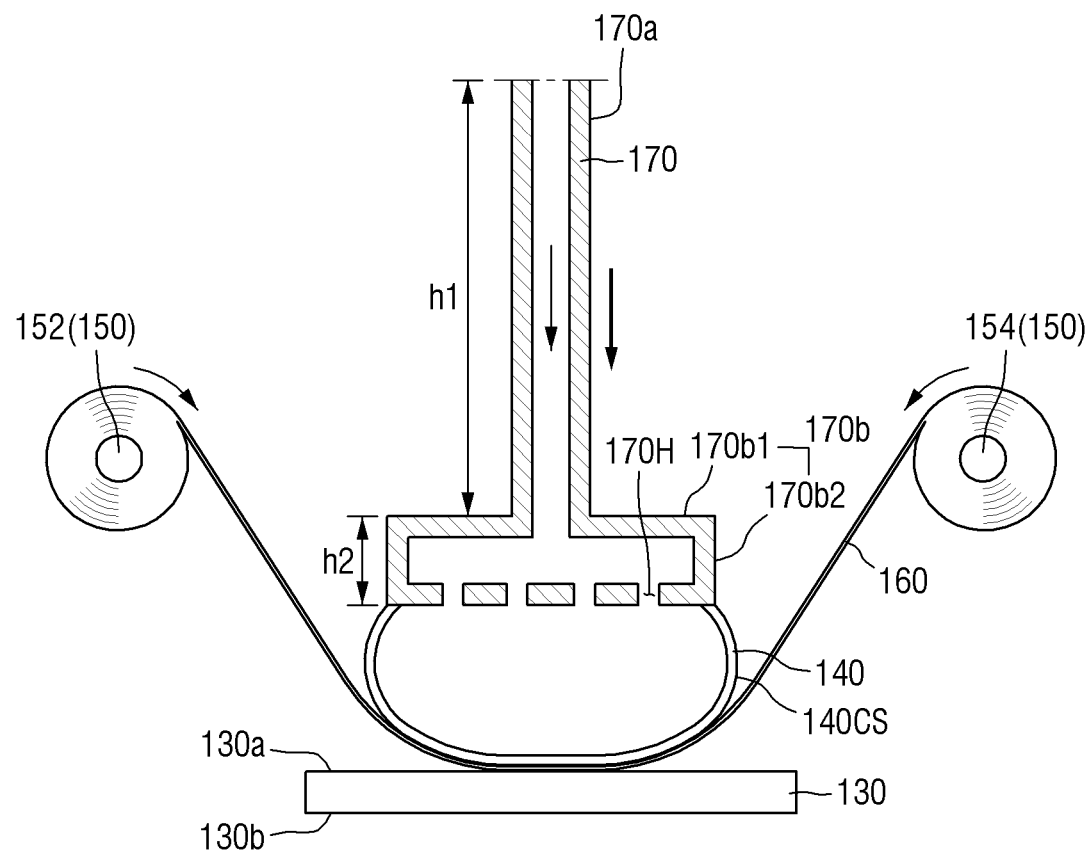
FIGS. 5a to 9 are schematic diagrams for explaining a method for fabricating a semiconductor package using the laminating device of FIG. 1a. For the sake of convenience of explanation, repeated parts of those described with reference to FIGS. 1a to 3 will be briefly described or omitted.

Referring to FIG. 5a, air may be injected into the pressurizing unit 140 via the plate holes 170H of the plate 170. As a result, the pressurizing unit 140 may be expanded. The expanded pressurizing unit 140 may bring the film 160 into contact with the first surface 130a of the substrate 130.

As illustrated in FIG. 5a, in some embodiments, the plate 170 may include a vertical portion 170a and a horizontal portion 170b. A height h1 of the vertical portion 170a in a direction perpendicular to an upper surface of the substrate stand 120 is higher than a height h2 of the horizontal portion 170b in the direction perpendicular to the upper surface of the substrate stand 120. The horizontal portion 170b further includes an upper portion 170b1 connected to the vertical portion 170a and a lower portion 170b2 configured to be connected to the uppermost portion of the pressurizing unit 140. The lower portion 170b2 of the horizontal portion 170b includes the plurality of plate holes 170H. In some embodiments, the vertical portion 170a and the horizontal portion 170b may form a single unit.

In some embodiments, the plate 170 may be operated in a direction coming closer to the substrate stand 120. For example, the plate 170 may be operated in a downward direction to come closer to the substrate stand 120. Since the pressurizing unit 140 is connected to the plate 170, the pressurizing unit 140 may also come closer to the substrate stand 120. Therefore, the operated plate 170 may improve the speed at which the film 160 comes into contact with the first surface 130a of the substrate 130.

In some embodiments, the film supply unit 150 may increase the length of the film 160 to be supplied. For example, the first roller 152 rotates clockwise and the second roller 154 rotates counter-clockwise to be able to increase the length of the film 160 extending between the first roller 152 and the second roller 154.

The rotation of the first roller 152 and the second roller 154 may be caused by tension applied to the film 160. The pressurizing unit 140 may apply tension to the film 160 with expansion, and the first roller 152 and the second roller 154 may rotate by the tension. Thus, the first roller 152 and the second roller 154 may minimize the application of tension to the film 160. If the first roller 152 and the second roller 154 do not rotate, the tension applied to the first roller 152 and the second roller 154 may continue to increase with the expansion of the pressurizing unit 140. This may cause deformation of the film 160, and may cause defects in the fabricated semiconductor package.

However, the present disclosure is not limited thereto. The first roller 152 and the second roller 154 may rotate autonomously with the expansion of the pressurizing unit 140. For example, the first roller 152 and the second roller 154 may autonomously rotate in accordance with the speed at which the pressurizing unit 140 expands. The speed at which the first roller 152 and the second roller 154 rotate may be adjusted, depending on the size of the pressurizing unit 140, the expansion speed of the pressurizing unit 140, the thickness of the film 160 and the like. Thus, the first roller 152 and the second roller 154 may prevent tension from being applied to the film 160.

Figure 5B:
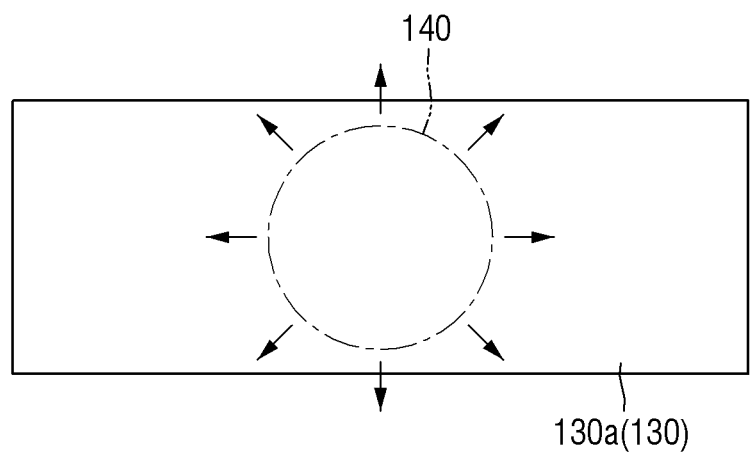

FIG. 5b is a diagram for explaining a shape in which the film 160 comes into contact with the first surface 130a of the substrate 130. Since the pressurizing unit 140 according to FIG. 1a has a hemispherical shape, when viewed from above, the pressurizing unit 140 may come into contact with the substrate 130 in a circular shape with the film 160 interposed therebetween. Thus, the pressurizing unit 140 may bring the film 160 into contact with the substrate 130 in a circular shape.

In some exemplary embodiments, the pressurizing unit 140 may bring the film 160 into contact with the central part of the substrate 130. As the pressurizing unit 140 is expanded, the pressurizing unit 140 may attach the film 160 to the substrate 130 in a direction from the central part of the substrate 130 toward the edge of the substrate 130. For example, the film 160 may come into contact with the central part of the substrate 130 in a circular shape. As the pressurizing unit 140 expands, the film 160 may come into contact with the substrate 130 in a direction in which the circular shape becomes large.

Figure 6A:
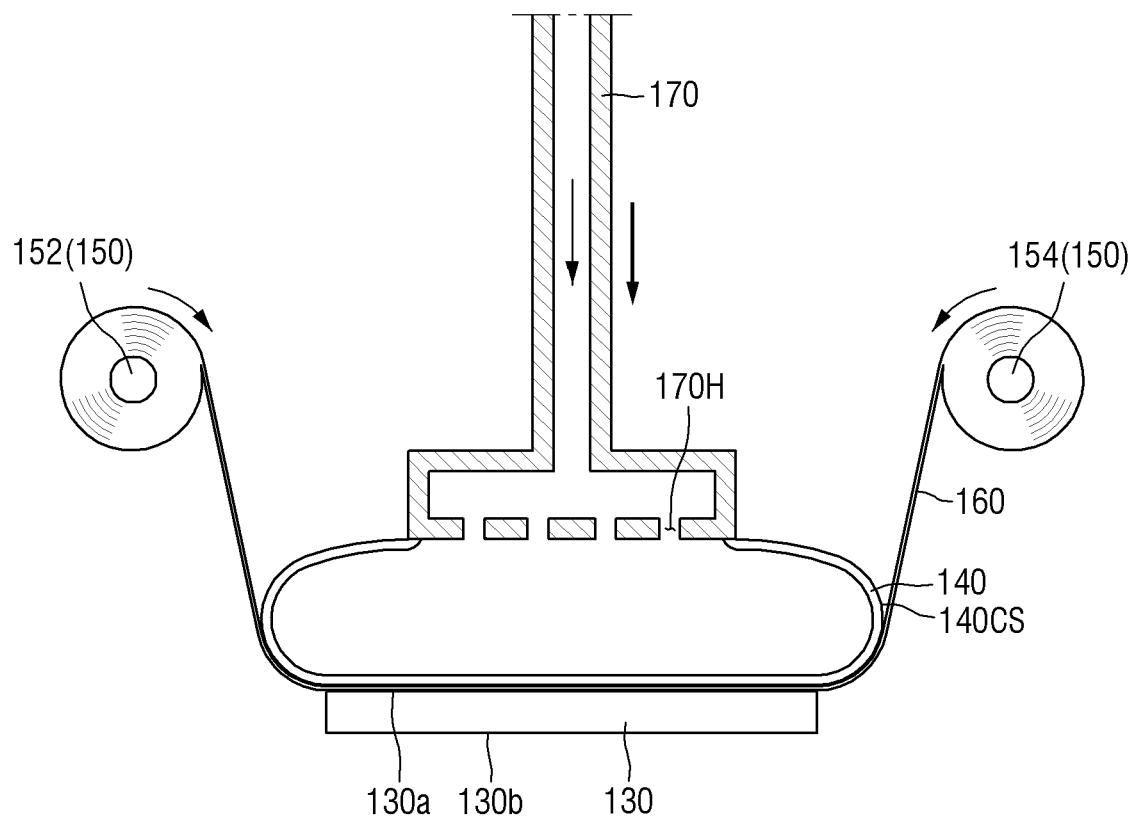

Referring to FIG. 6a, air may be continuously injected into the pressurizing unit 140 through the plate holes 170H of the plate 170. As a result, the pressurizing unit 140 may be continuously expanded. Subsequently, the expanded pressurizing unit 140 may attach the film 160 onto the first surface 130a of the substrate 130.

In some embodiments, the plate 170 may continue to operate in a direction coming closer to the substrate stand 120. Thus, the operated plate 170 may improve the speed at which the film 160 comes into contact with the first surface 130a of the substrate 130.

Figure 6B:
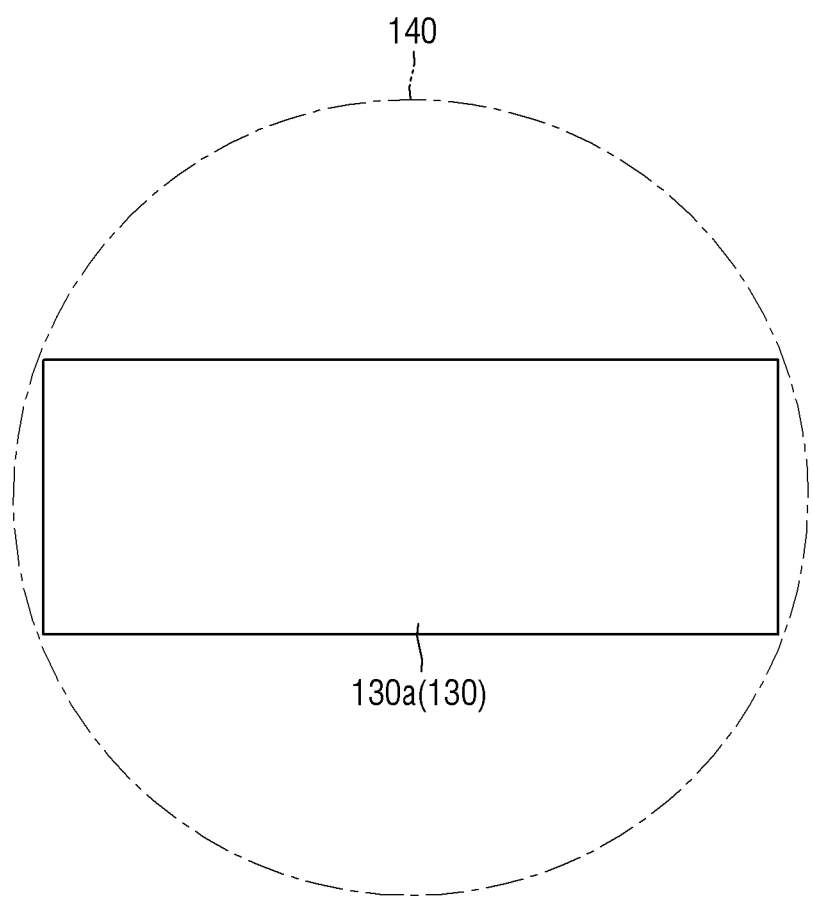

FIG. 6b is a diagram for explaining a shape in which the film 160 comes into contact with the first surface 130a of the substrate 130. Since the pressurizing unit 140 according to FIG. 1a has a hemispherical shape, when viewed from above, the pressurizing unit 140 may continuously expand in a circular shape. As a result, the pressurizing unit 140 may bring the film 160 into contact with the substrate 130 in a direction in which the circular shape becomes large, and the film 160 may be attached onto the first surface 130a of the substrate 130.

Figure 7:
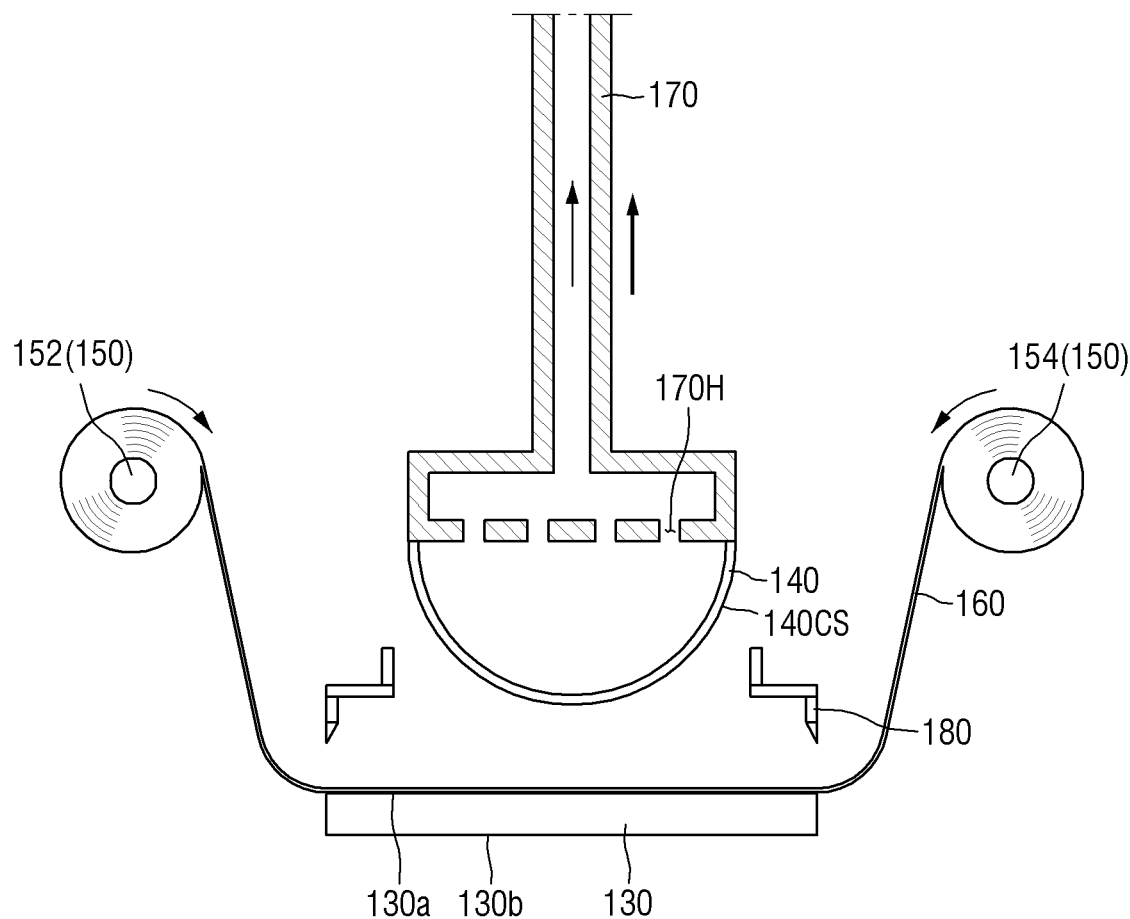

Referring to FIG. 7, the plate 170 may discharge (or remove/exhaust) air from the inside of the pressurizing unit 140. Also, the plate 170 may be operated in a direction away from the substrate stand 120. In some embodiments, when a vacuum state is formed inside the chamber 110 by the vacuum pump 112, the plate 170 may form the internal pressure of the pressurizing unit 140 in a vacuum state.

This allows the plate 170 to be spaced apart from the film 160 attached onto the substrate 130. Furthermore, the pressurizing unit 140 may shrink as the internal air is discharged. The contracted pressurizing unit 140 may maintain its original shape before expansion. For example, the contracted pressurizing unit 140 may maintain a hemispherical shape with an empty interior as illustrated in FIG. 1a.

Subsequently, by cutting a part of the film 160 that is not attached onto the substrate 130, the film 160 may be provided onto the first surface 130a of the substrate 130. For example, the film 160 that is not attached onto the substrate 130 may be cut, using a cutting unit 180.

The cutting unit 180 may cut the film 160 along the outer peripheral surface of the first surface 130a of the substrate 130. For example, when the first surface 130a of the substrate 130 has a rectangular shape, the cutting unit 180 may cut the film 160 into a rectangular shape. However, the present disclosure is not limited thereto, and the cutting unit 180 may cut the film 160 in various forms as necessary.

The cutting unit 180 may be operated in a direction coming closer to or away from the film 160. For example, the cutting unit 180 may be operated in the downward direction to cut the film 160. After cutting the film 160, the cutting unit 180 may be operated in the upward direction.

Figure 8:
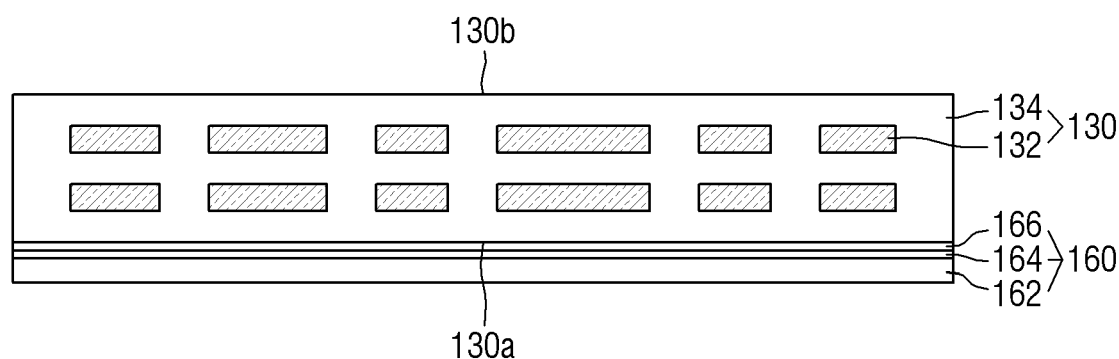

As a result, as illustrated in FIG. 8, the film 160 may be attached onto the first surface 130a of the substrate 130.

In some embodiments, the substrate 130 may be a printed circuit board. For example, the substrate 130 may include a plurality of wiring patterns 132 and an insulating layer 134. In some embodiments, the film 160 may include a plurality of films. For example, the film 160 may include a first protective film 162, a second protective film 164, and an adhesive film 166.

In some embodiments, a bubble inspection may be performed after attaching the film 160 onto the substrate 130. Execution of the bubble inspection may be carried out using, for example, the inspection device 40 of FIG. 3.

Figure 9:
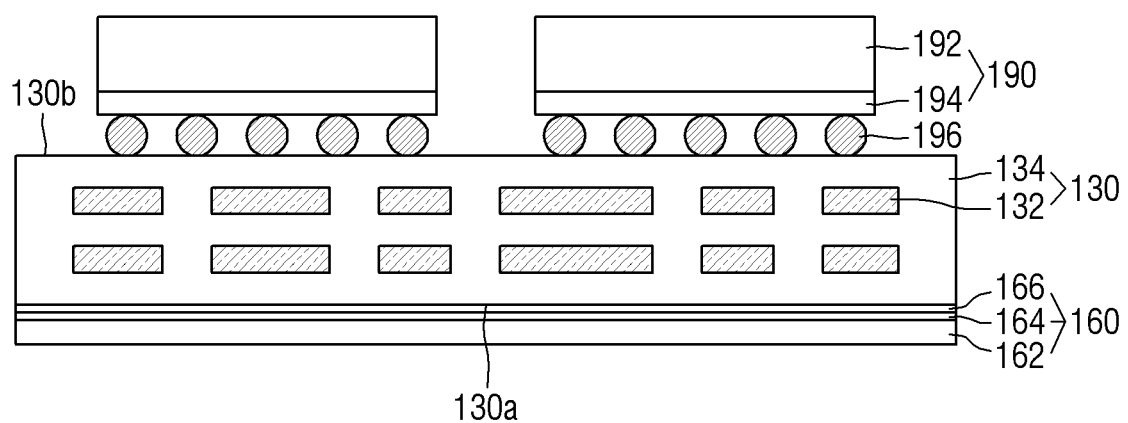

Referring to FIGS. 4 and 9, a semiconductor chip 190 is formed on the second surface 130b of the substrate 130 (S50).

Although only two semiconductor chips 190 are illustrated in FIG. 9, this is only for the sake of convenience of explanation, and two or more (or fewer) semiconductor chips 190 may be formed on the second surface 130b of the substrate 130.

The semiconductor chip 190 may include an element region 192 and an attachment region 194. For example, as illustrated in FIG. 9, an element region 192 may be disposed on the attachment region 194 such that a lower surface of the attachment region 194 faces the second surface 130b of the substrate 130 and an upper surface of the element region 192 faces away from second surface 130b of the substrate.

The element region 192 may be a region on which various circuit elements of the semiconductor chip 190 are disposed. The attachment region 194 may be a region in which the semiconductor chip 190 is mounted on the substrate 130 or another semiconductor chip.

The semiconductor chip 190 may be formed on the substrate 130 by, for example, flip chip bonding. For example, a plurality of conductive chip bumps 196 may be interposed between the second surface 130b of the substrate 130 and the semiconductor chip 190. Therefore, the substrate 130 and the semiconductor chip 190 may be electrically connected to each other. The plurality of conductive chip bumps 196 may be formed by, for example, a soldering process.

Tension applied to the film during the laminating process may cause defects such as bubble and warpage. Such defects cause a degradation of the yield of the semiconductor package.

However, in the laminating device according to some embodiments of the present inventive concept, it is possible to minimize the tension applied to the film 160 during the laminating process, using the pressurizing unit 140 including the convex surface 140CS. Accordingly, the laminating device according to some embodiments may prevent bubble and warpage of the film, and may improve the yield of semiconductor packages.

Figure 10:
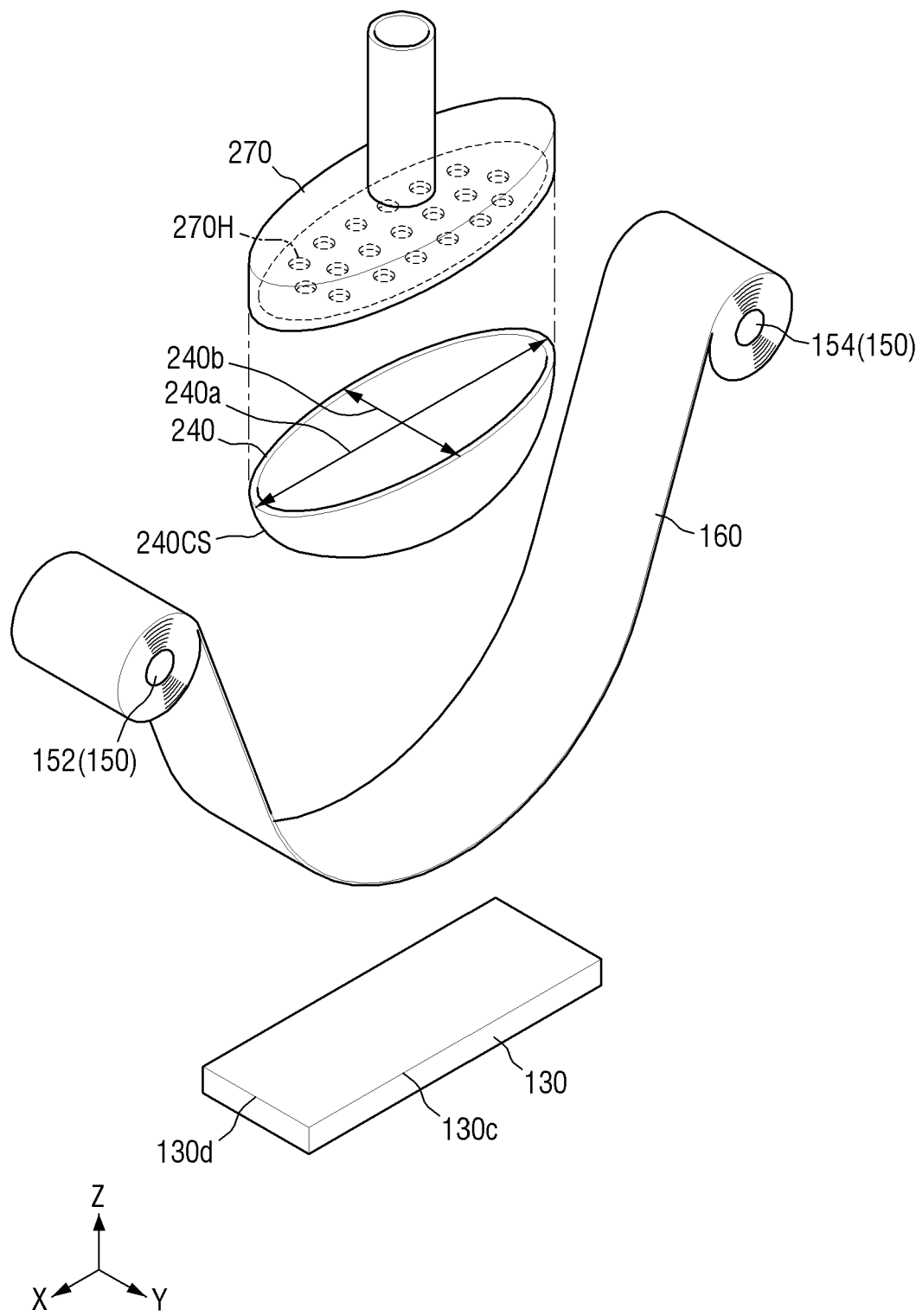
FIG. 10 is an exploded perspective view for explaining a laminating device according to some embodiments of the present inventive concept.

FIG. 10 is an exploded perspective view for explaining a laminating device according to some embodiments of the present inventive concept. For the sake of convenience of explanation, the repeated parts of those described in FIGS. 1a, 1b and 2 will be briefly described or omitted.

Referring to FIG. 10, a laminating device according to some exemplary embodiments includes a pressurizing unit 240 and a plate 270.

In some embodiments, the substrate 130 may include a long side 130c and a short side 130d. For example, the substrate 130 may include a long side 130c extending in a first direction X, and a short side 130d extending in a second direction Y intersecting with the first direction. Thus, when viewed from above, the substrate 130 may have a rectangular shape.

In some embodiments, the pressurizing unit 240 may be in the form of an elliptical hemisphere with an empty interior. Accordingly, the upper surface of the pressurizing unit 240 may have an elliptical shape. For example, the upper surface of the pressurizing unit 240 may include a long axis 240a, and a short axis 240b shorter than the long axis 240a.

In some embodiments, the long axis 240a may extend in the first direction X, and the short axis 240b may extend in the second direction Y intersecting with the first direction X. Accordingly, the long axis 240a of the pressurizing unit 240 and the long side 130c of the substrate 130 may extend in the same direction. In this specification, the term "the same" means not only completely the same thing but also a fine difference which may occur due to process margin and the like.

The pressurizing unit 240 may include a convex surface 240CS facing the upper surface of the substrate 130. The convex surface 240CS may be an outer surface of an elliptical hemisphere facing the upper surface of the substrate 130.

The plate 270 may be connected to the pressurizing unit 240. When the pressurizing unit 240 is in the shape of an elliptical hemisphere, the upper surface of the pressurizing unit 240 may have an elliptical shape. As a result, the bottom surface of the plate 270 may also have an elliptical shape.

FIGS. 11a to 12b are schematic diagrams for explaining a method for fabricating a semiconductor package using the laminating device of FIG. 10. For the sake of convenience of explanation, repeated parts as those described with reference to FIGS. 5a to 9 will be briefly described or omitted.

Referring also to 11a, air may be injected into the pressurizing unit 240 through the plate 270. As a result, the pressurizing unit 240 may be expanded. The expanded pressurizing unit 240 may bring the film 160 into contact with the top of the first surface 130a of the substrate 130.

Figure 11A:
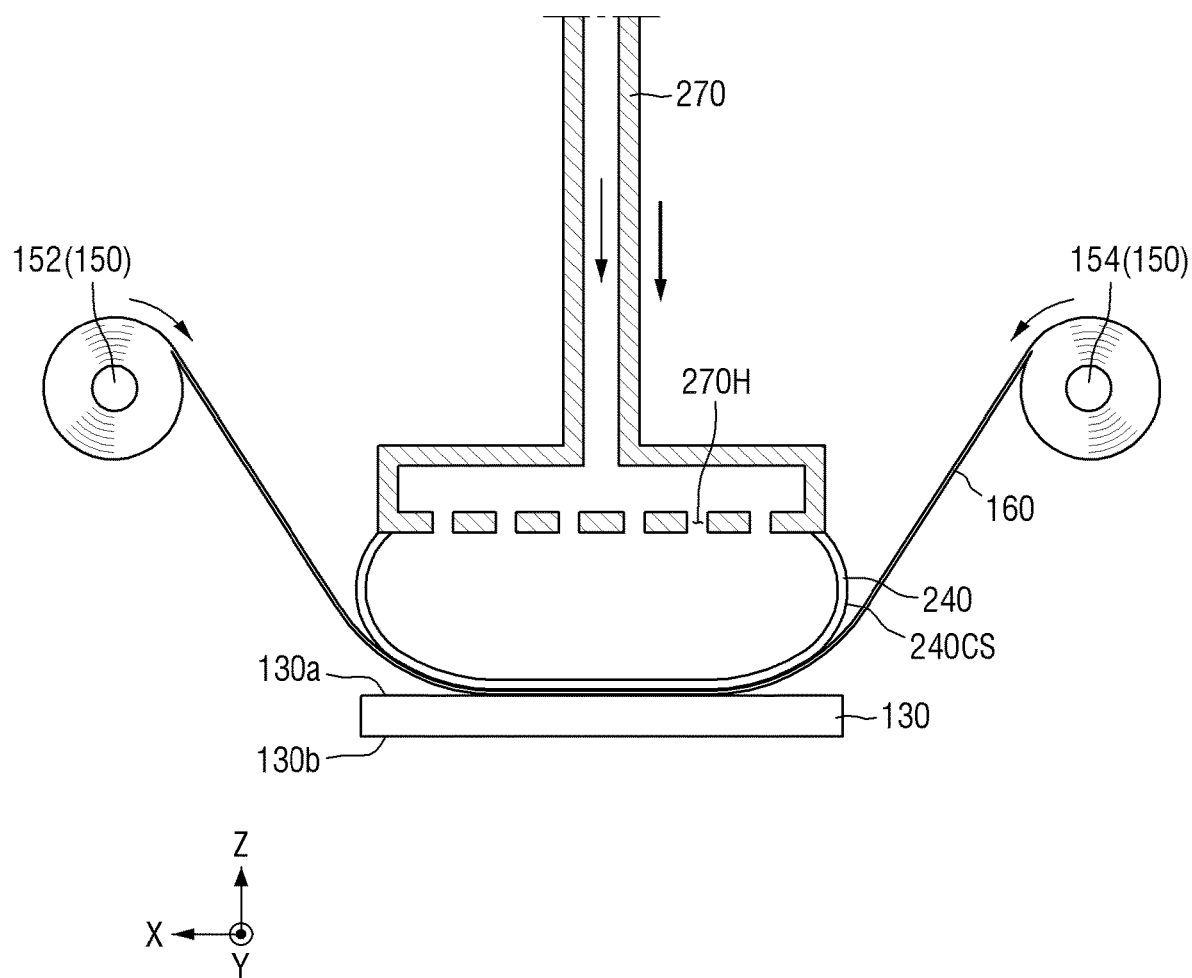
FIGS. 11a to 12b are schematic diagrams for explaining a method for fabricating a semiconductor package using the laminating device of FIG. 10.
Figure 11B:
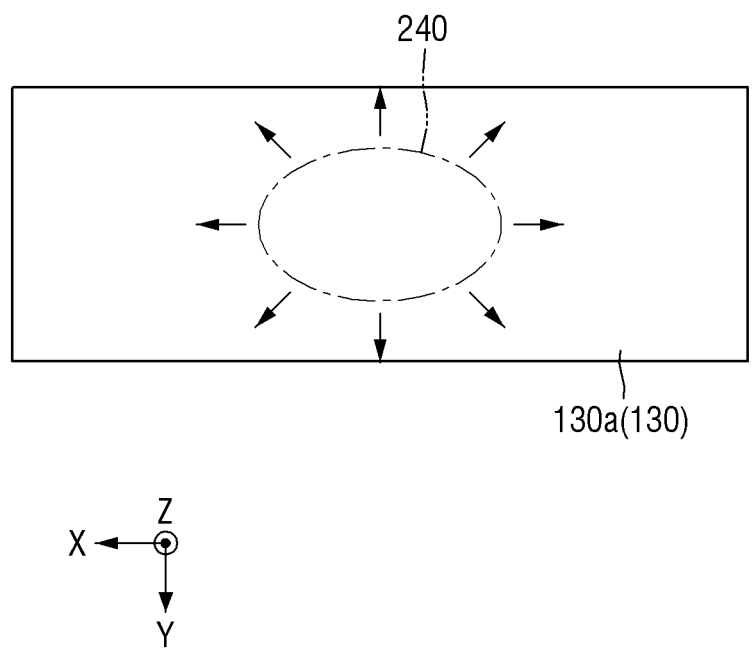

FIG. 11b is a diagram for explaining a shape in which the film 160 comes into contact with the first surface 130a of the substrate 130. Since the pressurizing unit 240 according to FIG. 10 has an elliptical hemispherical shape, when viewed from above, the pressurizing unit 240 may come into contact with substrate 130 in an elliptical shape with the film 160 interposed therebetween. As a result, the pressurizing unit 240 may bring the film 160 into contact with the substrate 130 in an elliptical shape.

In some exemplary embodiments, the pressurizing unit 240 may bring the film 160 into contact with the central part of the substrate 130. As the pressurizing unit 240 is expanded, the pressurizing unit 240 may attach the film 160 to the substrate 130 in the direction from the central part of the substrate 130 toward the edge of the substrate 130. For example, the film 160 may come into contact with the central part of the substrate 130 in an elliptical shape. As the pressurizing unit 240 expands, the film 160 may come into contact with the substrate 130 in a direction in which the elliptical shape becomes larger.

Figure 12A:
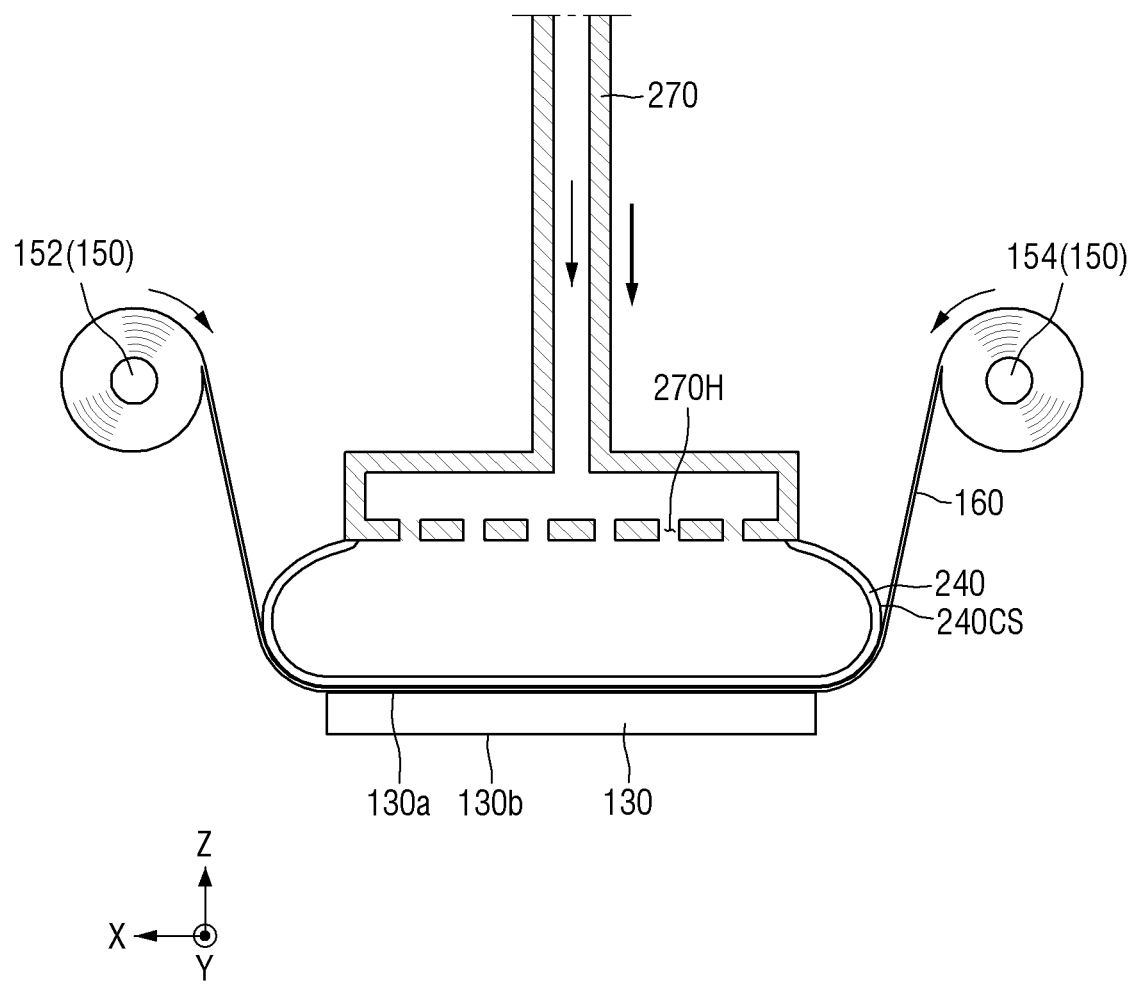

Referring to FIG. 12a, air may be continuously injected into the pressurizing unit 240 through the plate 270. As a result, the pressurizing unit 240 may continuously expand. Continuously expanded pressurizing unit 240 allows the film 160 to be attached onto the first surface 130a of the substrate 130.

Figure 12B:
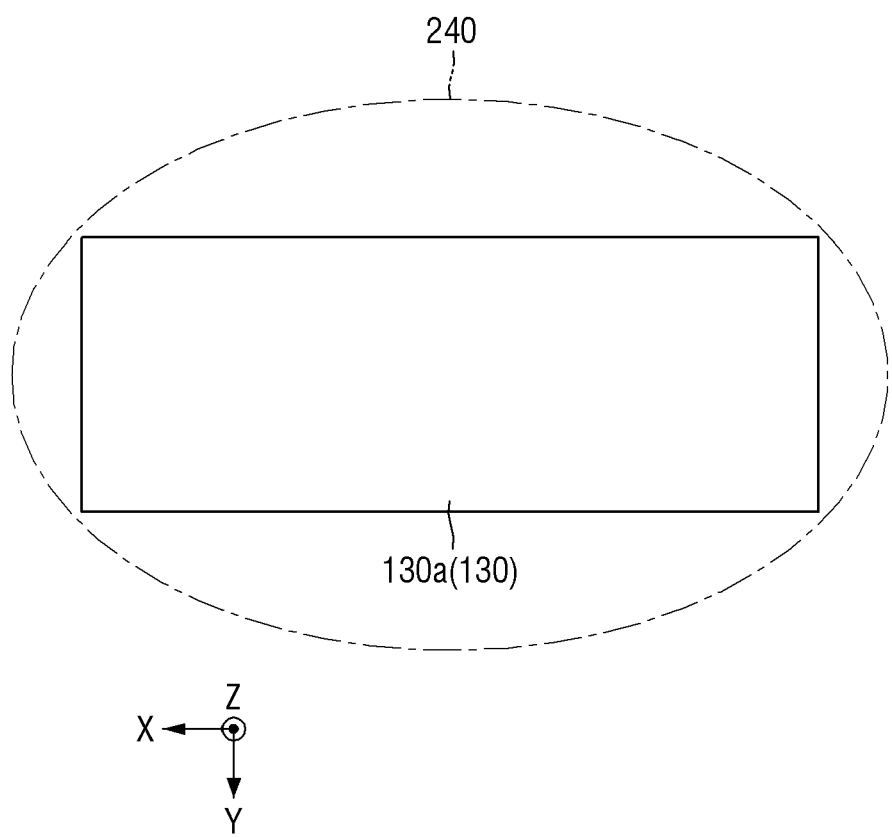

FIG. 12b is a diagram for explaining a shape in which the film 160 comes into contact with the first surface 130a of the substrate 130. Since the pressurizing unit 240 according to FIG. 10 is an elliptical hemispherical shape, when viewed from the above, the pressurizing unit 240 may continuously expand in an elliptical shape. As a result, the pressurizing unit 240 may bring the film 160 into contact with the substrate 130 in a direction in which the elliptical shape becomes larger, and the film 160 may be attached onto the first surface 130a of the substrate 130.

Figure 13:
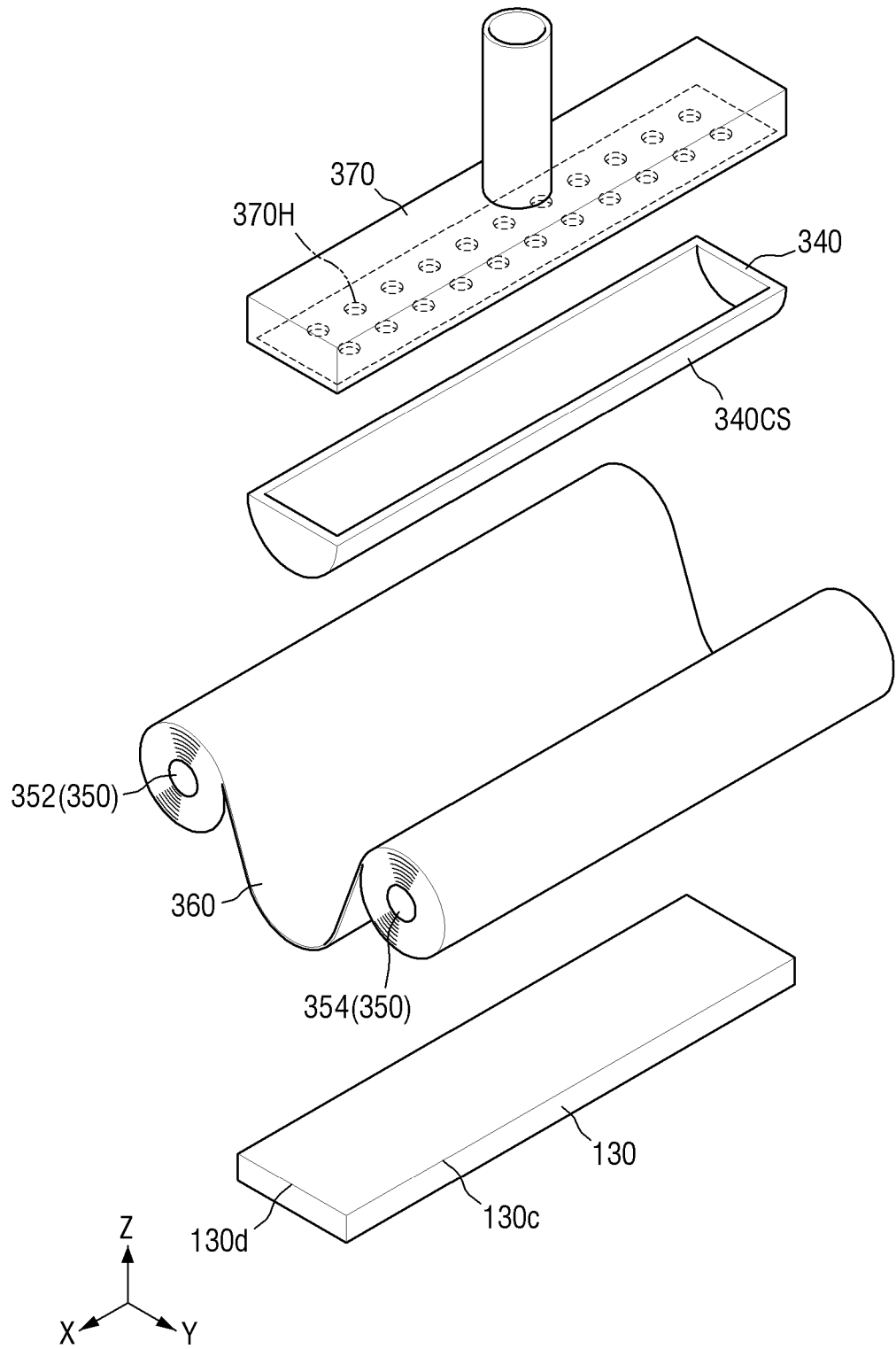
FIG. 13 is an exploded perspective view for explaining a laminating device according to some embodiments of the present inventive concept.

FIG. 13 is an exploded perspective view for explaining a laminating device according to some embodiments of the present inventive concept. For the sake of convenience of explanation, the repeated parts of those described in FIGS. 1a, 1b, 2 and 10 will be briefly described or omitted.

Referring to FIG. 13, a laminating device according to some embodiments includes a pressurizing unit 340 and a plate 370.

In some embodiments, the pressurizing unit 340 may be in the form of a semi-cylinder with an empty interior. For example, the pressurizing unit 340 may extend along the first direction X. The cross-section of the pressurizing unit 340 intersecting with the first direction X may have a hemispherical shape.

In some embodiments, as illustrated in FIG. 13, the pressurizing unit 340 may have a shape extending along the first direction X. Therefore, the pressurizing unit 340 and the substrate 130 may have shapes that extend along the same direction.

The pressurizing unit 340 may include a convex surface 340CS facing the upper surface of the substrate 130. In this exemplary embodiment, the convex surface 340CS may be an outer surface of the semi-cylinder facing the upper surface of the substrate 130.

The plate 370 may be connected to the pressurizing unit 340. When the pressurizing unit 340 has a semi-cylindrical shape, the upper surface of the pressurizing unit 340 may have a rectangular shape. As a result, the bottom surface of the plate 370 may also have a rectangular shape.

FIGS. 14a to 15b are schematic diagrams for explaining a method for fabricating a semiconductor package using the laminating device of FIG. 13. For the sake of convenience of explanation, repeated parts as those described with reference to FIGS. 5a to 9 will be briefly described or omitted.

Figure 14A:
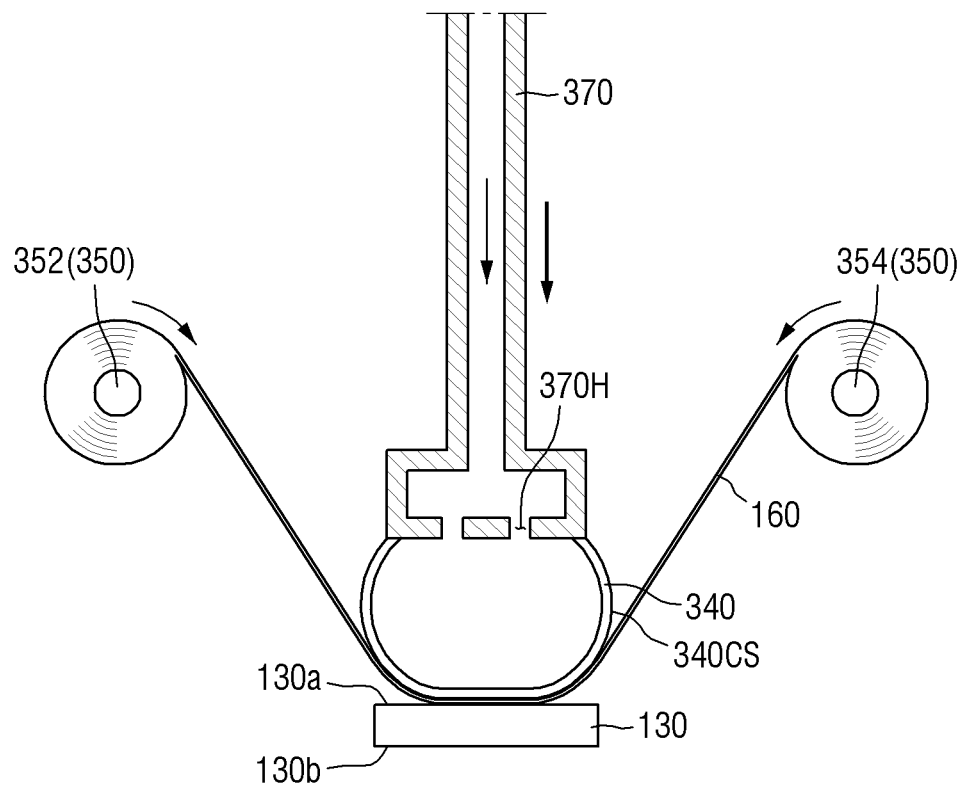
FIGS. 14a to 15b are schematic diagrams for explaining a method for fabricating a semiconductor package using the laminating device of FIG. 13.

Referring to FIG. 14a, air may be injected into the pressurizing unit 340 via the plate 370. As a result, the pressurizing unit 340 may be expanded. The expanded pressurizing unit 340 may bring the film 160 into contact with the first surface 130a of the substrate 130.

Figure 14B:
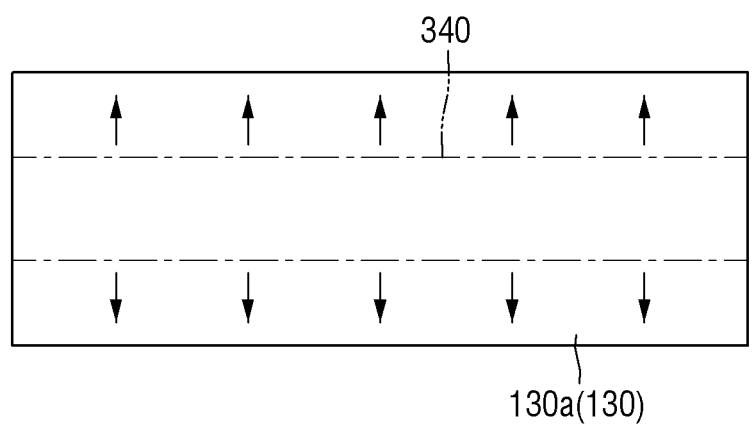

FIG. 14b is a diagram for explaining a shape in which the film 160 comes into contact with the top of the first surface 130a of the substrate 130. Since the pressurizing unit 340 according to FIG. 13 has a semi-cylindrical shape, when viewed from above, the pressurizing unit 340 may come into contact with the substrate 130 in a rectangular shape with the film 160 interposed therebetween. As a result, the pressurizing unit 340 may bring the film 160 into contact with the top of the substrate 130 in a rectangular shape.

In some embodiments, the pressurizing unit 340 may bring the film 160 into contact with the central part of the substrate 130. As the pressurizing unit 340 is expanded, the pressurizing unit 340 may attach the film 160 to the substrate 130 in a direction from the center part of the substrate 130 toward the edge of the substrate 130. For example, the film 160 may come into contact with the central part of the substrate 130 in a rectangular shape. As the pressurizing unit 340 expands, the film 160 may come into contact with the substrate 130 in a direction in which the rectangular shape becomes larger.

Referring also to 15a, air may be continuously injected into the pressurizing unit 340 via the plate 370. As a result, the pressurizing unit 340 may be continuously expanded. The continuously expanded pressurizing unit 340 may attach the film 160 onto the first surface 130a of the substrate 130.

Figure 15A:
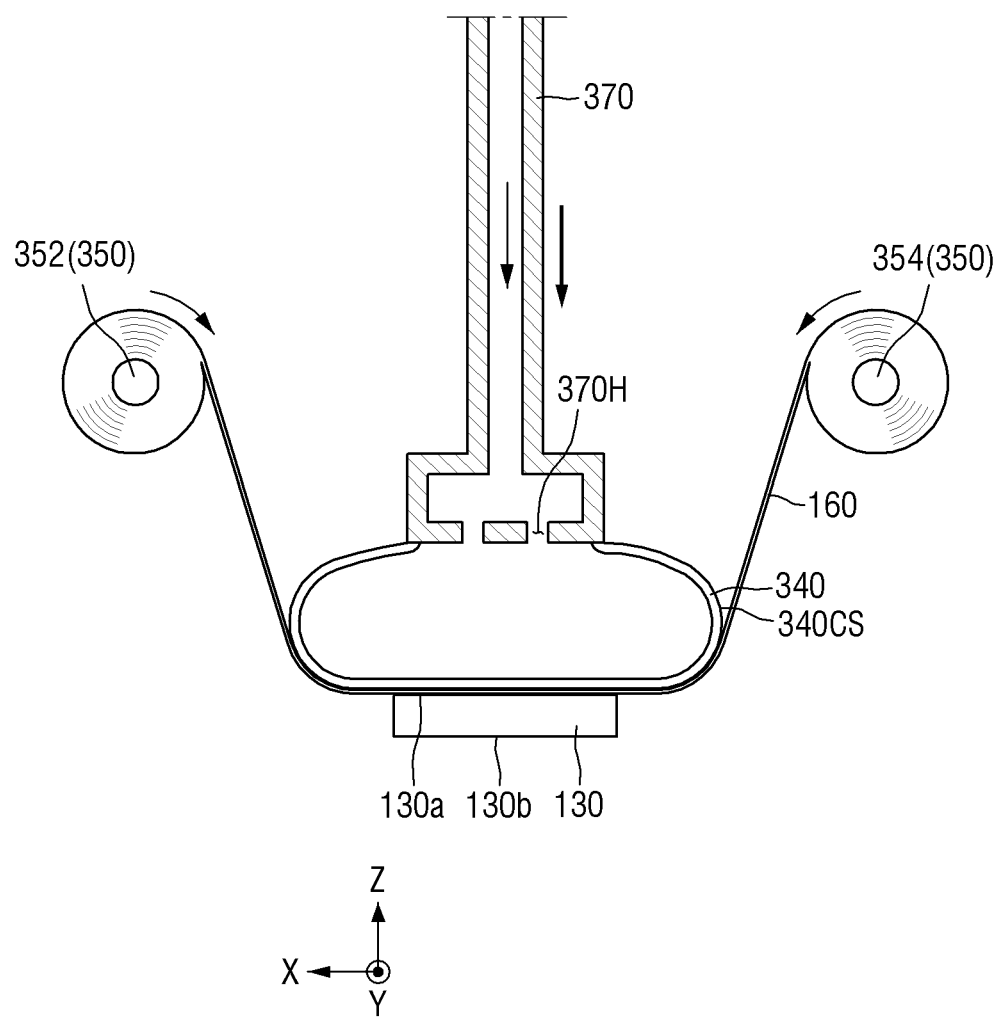
Figure 15B:
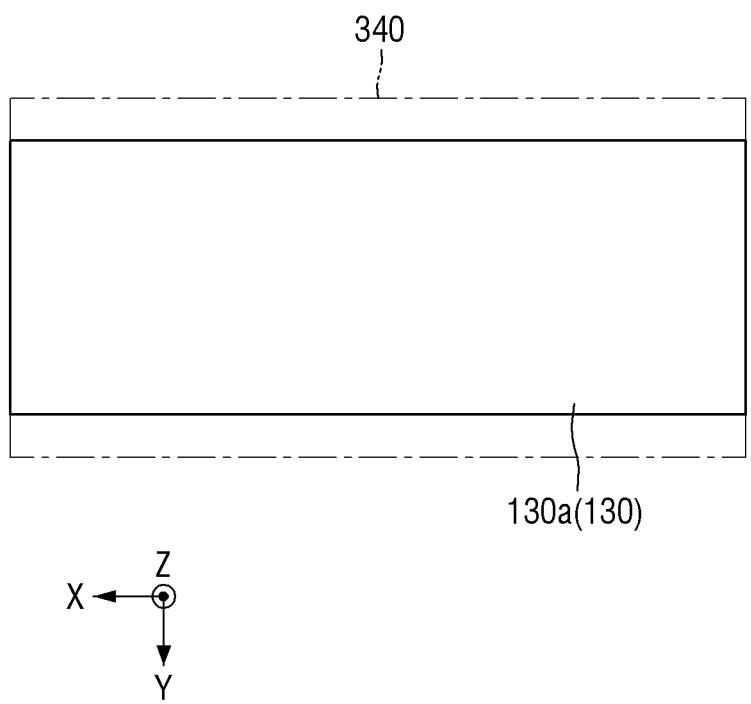

FIG. 15b is a diagram for explaining a shape in which the film 160 comes into contact with the first surface 130a of the substrate 130. Since the pressurizing unit 340 according to FIG. 13 has a semi-cylindrical shape, when viewed from above, the pressurizing unit 340 may continuously expand in a rectangular shape. As a result, the pressurizing unit 340 may bring the film 160 into contact with the substrate 130 in a direction in which the rectangular shape becomes larger, and the film 160 may be attached onto the first surface 130a of the substrate 130.

Figure 16:
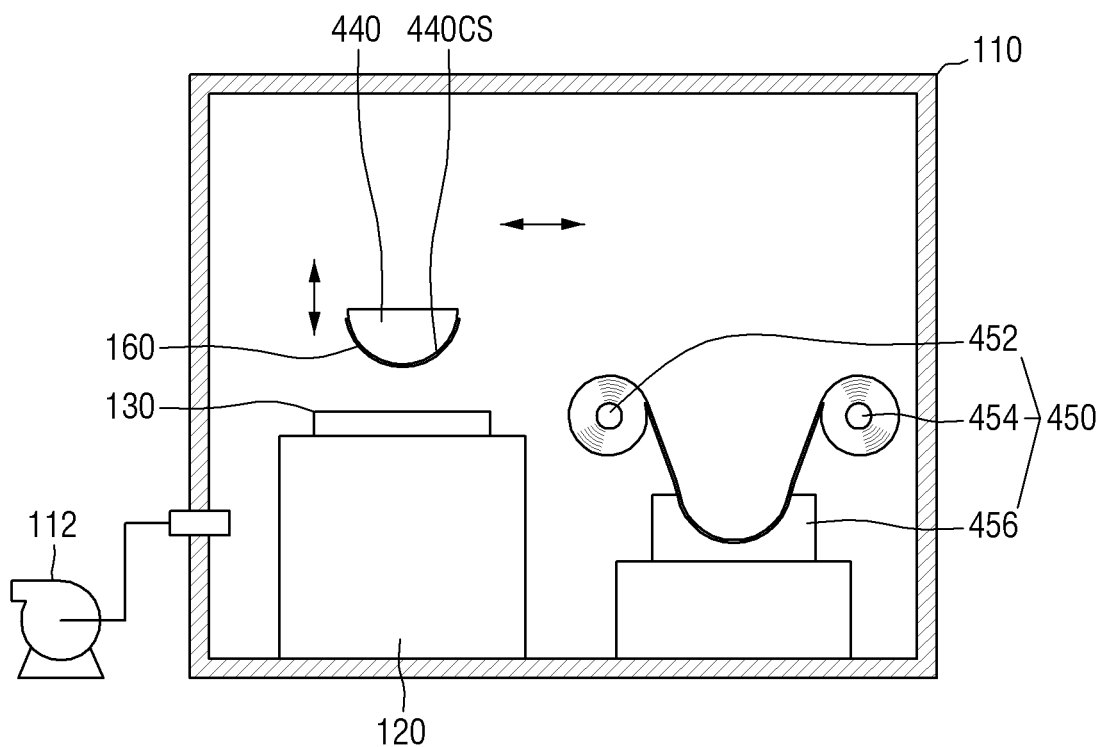
FIG. 16 is a schematic view for explaining a laminating device according to some embodiments of the present inventive concept.
Figure 17:
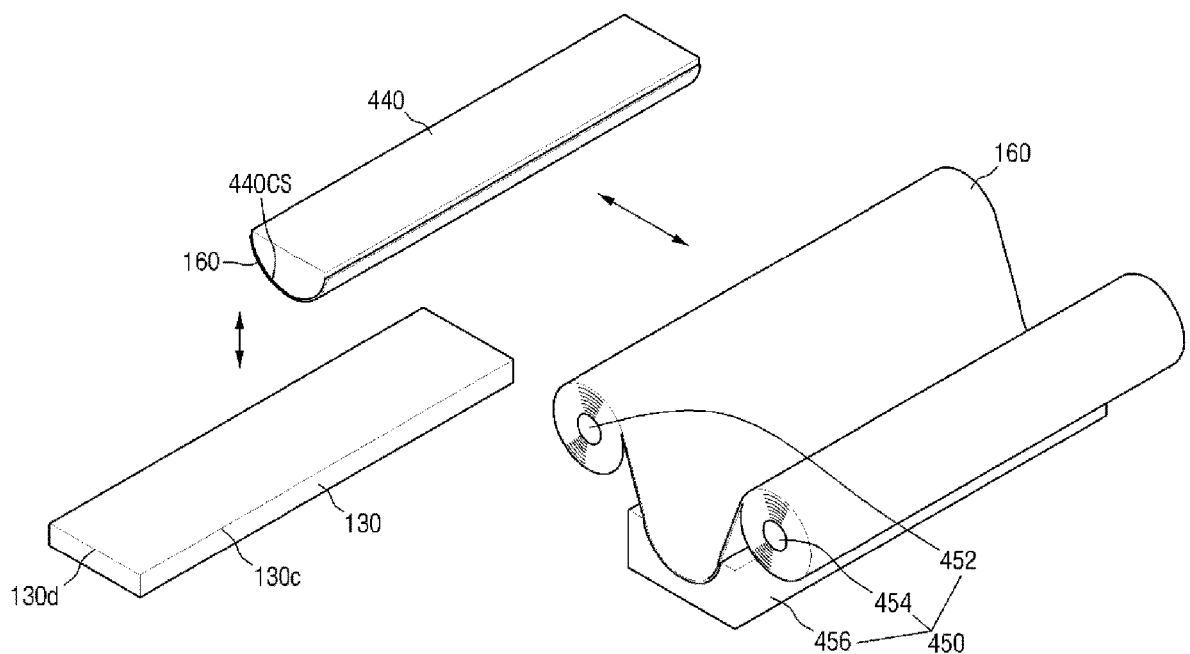
FIG. 17 is an exploded perspective view for explaining the laminating device of FIG. 16.

FIG. 16 is a schematic view for explaining a laminating device according to some exemplary embodiments of the present inventive concept. FIG. 17 is an exploded perspective view for explaining the laminating device of FIG. 16. For the sake of convenience of explanation, the repeated parts of those described with reference to FIGS. 1a, 1b and 2 will be briefly explained or omitted.

Referring to FIGS. 16 and 17, the laminating device according to some embodiments includes a pressurizing unit 440 and a film supply unit 450.

The pressurizing unit 440 may be disposed on the substrate stand 120. Further, the pressurizing unit 440 may include a convex surface 440CS facing the upper surface of the substrate stand 120. For example, as illustrated in FIG. 17, the pressurizing unit 440 may have a semi-cylinder shape. In this exemplary embodiment, the convex surface 440CS may be an outer surface of the semi-cylinder facing the upper surface of the substrate stand 120.

The pressurizing unit 440 may attach the film 160 onto the substrate 130, using the convex surface 440CS. This will be described later in detail with reference to FIGS. 18 to 24.

The film supply unit 450 may supply the film 160 between the substrate 130 and the pressurizing unit 440. Specifically, the film supply unit 450 may supply the film 160 so that the film 160 can be attached onto the first surface 130a of the substrate 130.

In some embodiments, the film supply unit 450 may supply the film 160 such that the film 160 extends along the convex surface 440CS of the pressurizing unit 440. For example, the film supply unit 450 may include a third roller 452, a fourth roller 454, and a film stand 456. The film supply unit 450 may supply the film 160 to extend along the convex surface 440CS of the pressurizing unit 440, using the third roller 452, the fourth roller 454, and the film stand 456. This will be described later in detail with reference to FIGS. 19 to 21.

Figure 18:
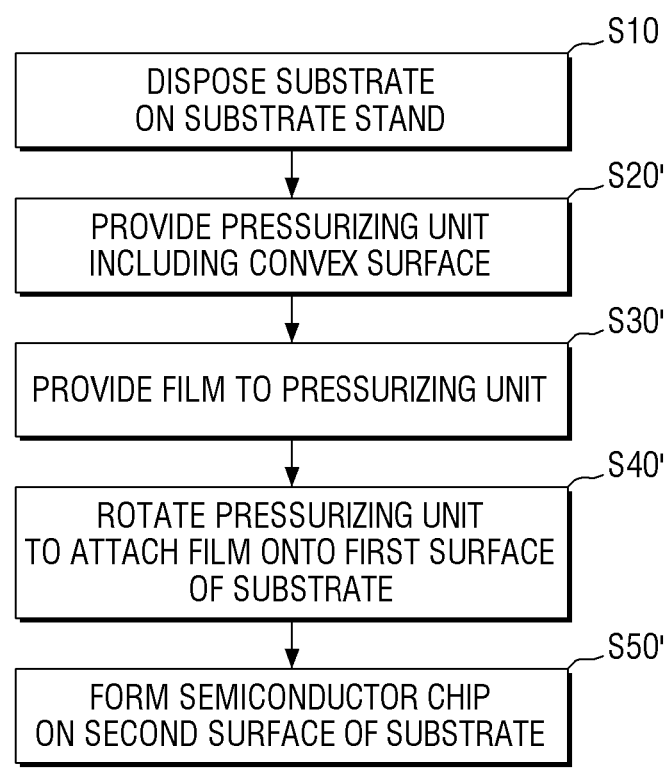
FIG. 18 is a flowchart for explaining a method for fabricating a semiconductor package using the laminating device of FIG. 16.

FIG. 18 is a flowchart for explaining a method for fabricating a semiconductor package using the laminating device of FIG. 16. FIGS. 19 to 24 are schematic diagrams for explaining the method for fabricating the semiconductor package using the laminating device according to some embodiments of the present inventive concept. For the sake of convenience of explanation, the repeated parts as those described with reference to FIGS. 4 to 9 will be briefly described or omitted.

Referring to FIGS. 16 and 18, the substrate 130 is disposed on the substrate stand 120 (S10'). Also, the pressurizing unit 440 including the convex surface 440CS is provided (S20').

Referring to FIGS. 18 to 21, the film 160 is provided to the pressurizing unit 440 (S30').

Figure 19:
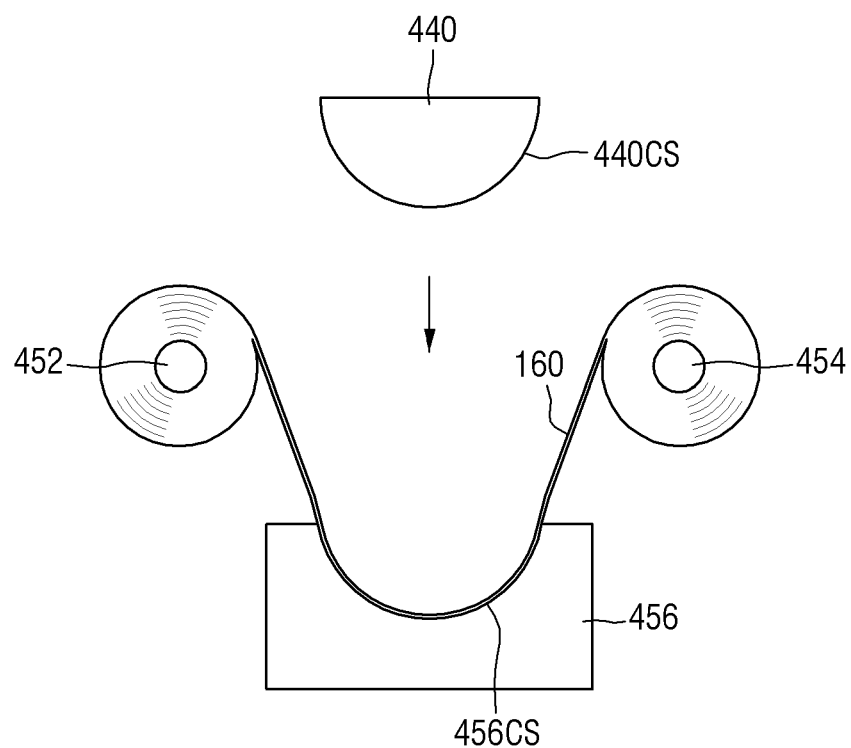
FIGS. 19 to 24 are schematic diagrams for explaining the method for fabricating the semiconductor package using the laminating device according to some embodiments of the present inventive concept.

Referring to FIG. 19, the pressurizing unit 440 may be provided on the film 160. Subsequently, the pressurizing unit 440 may be moved in a direction coming closer to the film 160.

The film stand 456 may supply the film 160. For example, the film 160 may extend between the third roller 452 and the fourth roller 454. The film 160 extending between the third roller 452 and the fourth roller 454 may be disposed on the film stand 456.

The film stand 456 may include a concave surface 456CS. The concave surface 456CS of the film stand 456 may have a shape that corresponds to the convex surface 440CS of the pressurizing unit 440. For example, in the case where the convex surface 440CS of the pressurizing unit 440 has a hemispherical shape, the concave surface 456CS of the film stand 456 may have a shape that accommodates a hemisphere. The film 160 extending between the third roller 452 and the fourth roller 454 may be disposed on the concave surface 456CS of the film stand 456.

Figure 20:
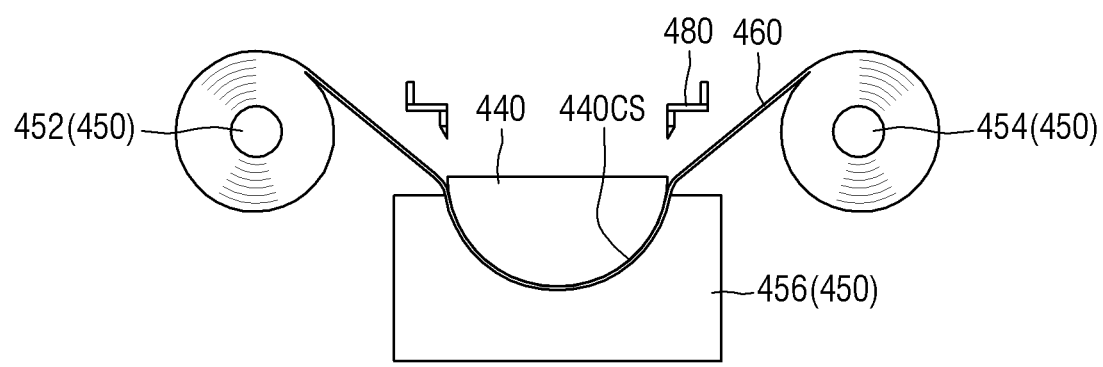

Referring to FIG. 20, the film 160 may be brought into contact with the convex surface 440CS of the pressurizing unit 440. Since the concave surface 456CS of the film stand 456 corresponds to the convex surface 440CS of the pressurizing unit 440, the film 160 may extend along the convex surface 440CS.

Subsequently, a part of the film 160 which does not come into contact with the pressurizing unit 440 may be cut. For example, it is possible to cut the film 160 which does not come into contact with the pressurizing unit 440, using the cutting unit 480.

Figure 21:
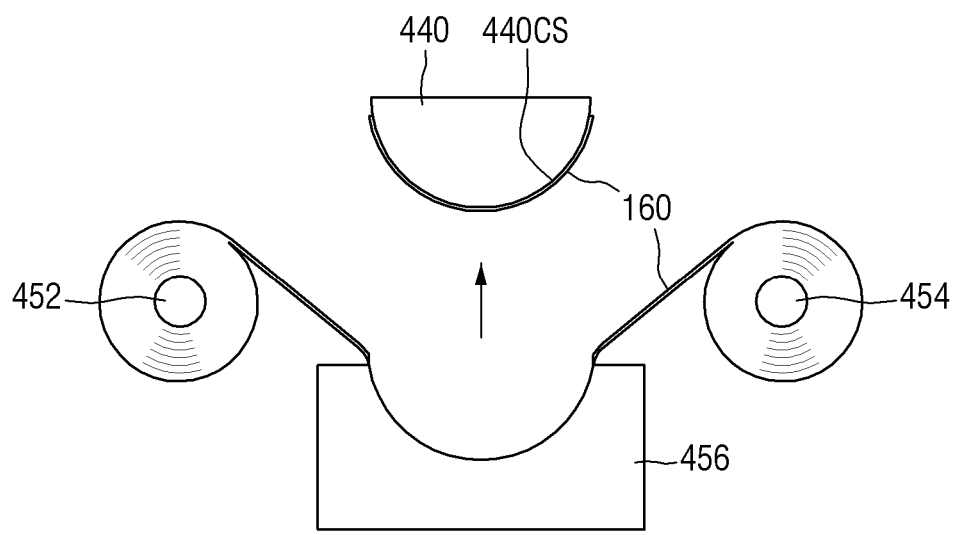

Referring to FIG. 21, the pressurizing unit 440 may be spaced apart from the film stand 456. In this exemplary embodiment, the film 160 may remain attached to the convex surface 440CS of the pressurizing unit 440.

In some embodiments, the film supply unit 450 may attach the film 160 to the convex surface 440CS, using van der Waals force. For example, a thin-thickness film may be attached to the convex surface 440CS of the pressurizing unit 440 by van der Waals force. The thickness of the film 160 may be, for example, 50 μm or less. As a result, when the pressurizing unit 440 is spaced apart from the film stand 456, the film 160 may remain attached to the convex surface 440CS of the pressurizing unit 440 by van der Waals force. However, the present disclosure is not limited thereto, and the film 160 may be attached on the convex surface 440CS in various ways. For example, the film 160 may also be attached onto the convex surface 440CS with an adhesive.

Referring to FIGS. 18, and 22a to 24, the pressurizing unit 440 is rotated to attach the film 160 onto the first surface 130a of the substrate 130 (S40').

Figure 22A:
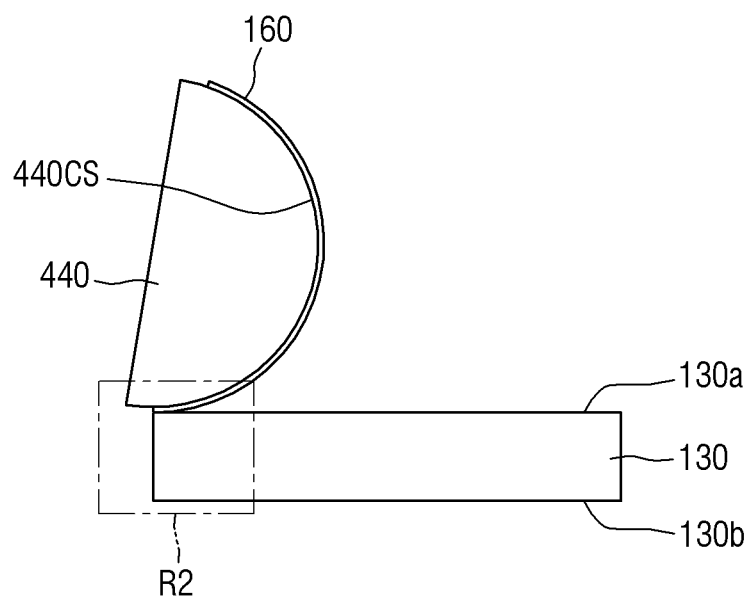

Referring to FIG. 22a, the film 160 may be brought into contact with the top of the first surface 130a of the substrate 130. For example, the film 160 may be brought into contact with the edge of the first surface 130a.

Figure 22B:
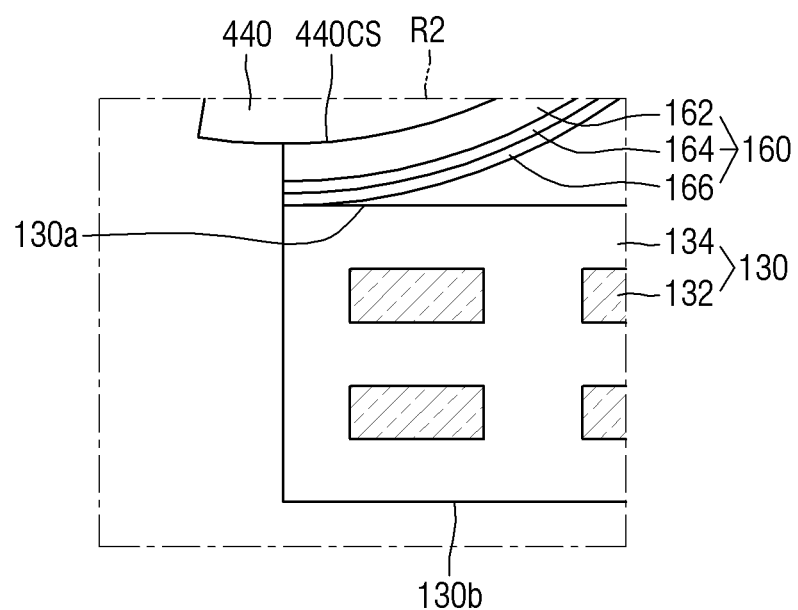

FIG. 22b is an enlarged view of a second region R2 of FIG. 22a. Referring to FIG. 22b, for example, the edge of the adhesive film 166 may come into contact with the edge of the substrate 130. In FIG. 22b, the distal end of the film 160 and the distal end of the substrate 130 are illustrated as being located on a straight line, but the present disclosure is not limited thereto. For example, a part of the film 160 may protrude from the substrate 130, or a part of the substrate 130 may protrude from the film 160.

Figure 23:
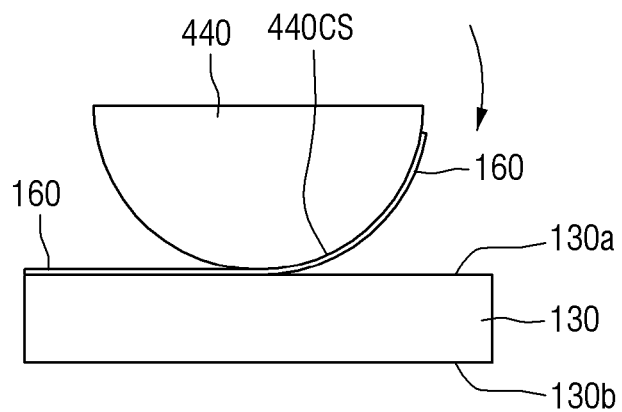
Figure 24:
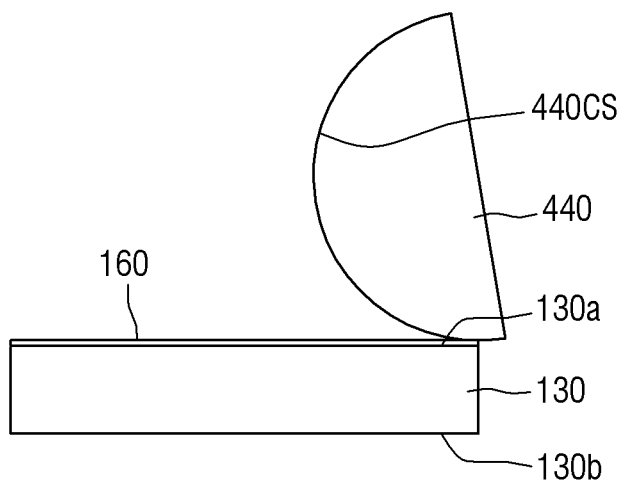

Referring to FIGS. 23 and 24, the pressurizing unit 440 may rotate to attach the film 160 onto the first surface 130a of the substrate 130.

Since the pressurizing unit 440 includes the convex surface 440CS, with rotation of the pressurizing unit 440, the area of the film 160 coming into contact with the first surface 130a of the substrate 130 may be made wider. For example, the pressurizing unit 440 which brings the film 160 into contact with the top of the substrate 130 at the left edge of the substrate 130 may rotate in the clockwise direction to bring the film 160 into contact with the top of the substrate 130. The pressurizing unit 440 that continues to rotate may attach the film 160 to the top of the first surface 130a of the substrate 130.

For example, the pressurizing unit 440 may roll on the substrate 130, using the convex surface 440CS, thereby attaching the film 160 onto the substrate 13. For example, the laminating device according to some embodiments of the present inventive concept may prevent tension from being applied to the film 160. Thus, the laminating device according to some embodiments may prevent bubble and warpage of the film, and may improve the yield of the semiconductor packages.

Subsequently, referring again to FIG. 18, a semiconductor chip 190 is formed on the second surface 130b of the substrate 130 (S50').

Formation of the semiconductor chip 190 on the second surface 130b of the substrate 130 may be substantially the same as that described with reference to FIGS. 4 and 9.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A laminating device comprising:
a substrate stand on which a substrate is placed;
a press above the substrate stand, the press including an expandable, convex surface facing an upper surface of the substrate stand;
a plate which is connected to the press to inject air into the press;
a first roller configured to hold a first film roll; and
a second roller configured to hold a second film roll,
wherein the first roller and the second roller are configured to rotate in opposite directions, respectively, to cooperatively supply, from the first film roll and the second film roll, a film between the substrate stand and the press,
the first roller and the second roller are disposed on opposite sides of the press, and
the press attaches the film onto the substrate, while expanding.

2. The laminating device of claim 1,
wherein the substrate is a printed circuit board (PCB).

3. The laminating device of claim 2,
wherein the printed circuit board has a thickness of 0.2 mm or less.

4. The laminating device of claim 2,
wherein the film is a PCB protective film.

5. The laminating device of claim 1,
wherein the press is in the shape of a hemisphere with an empty interior.

6. The laminating device of claim 1,
wherein the press is in the shape of an elliptical hemisphere with an empty interior having a long axis extending along a first direction.

7. The laminating device of claim 6,
wherein the substrate includes a long side extending along the first direction, and a short side extending along a second direction intersecting with the first direction.

8. The laminating device of claim 1,
wherein the press is in the shape of a semi-cylinder with an empty interior.

9. The laminating device of claim 1,
wherein the press includes at least one of natural rubber, neoprene, nitrile rubber, butyl rubber, EPDM (ethylene propylene diene monomer) rubber, fluoro elastomer, polyurethane, PVC (polyvinyl chloride) or a combination thereof.

10. The laminating device of claim 1,
wherein the press is interposed between the substrate stand and the plate, and
the plate is operated in a direction moving closer to the substrate stand.

11. The laminating device of claim 1,
wherein the first roller and the second roller are configured to supply an additional length of the film with expansion of the press.

12. A laminating device comprising:
a substrate stand on which a substrate is placed;
a press above the substrate stand, the press including an expandable, convex surface facing an upper surface of the substrate;
a first roller configured to hold a first film roll; and
a second roller configured to hold a second film roll,
wherein the first roller and the second roller are configured to rotate in opposite directions, respectively, to cooperatively supply, from the first film roll and the second film roll, a film between the substrate stand and the press, and
wherein the press attaches the film onto the substrate, while expanding, and
the first roller and the second roller are configured to additionally rotate in opposite directions, respectively, to cooperatively supply, from the first film roll and the second film roll, an additional length of the film between the press and the substrate.

13. The laminating device of claim 12,
wherein the first roller and the second roller are arranged to hold the film, wherein the film extends between the first film roll and the second film roll.

14. The laminating device of claim 13,
wherein the first roller and the second roller are disposed to be higher than the lowermost portion of the press.

* * * * *